United States Patent
Tsuboi

(10) Patent No.: US 11,527,591 B2
(45) Date of Patent: Dec. 13, 2022

(54) LIGHT EMITTING DEVICE FOR DISPLAY DEVICE MINIATURIZING PIXELS AND SUPPRESSING DEGRADATION IN IMAGE QUALITY

(71) Applicant: CANON KABUSHIKI KAISHA, Tokyo (JP)

(72) Inventor: Hiromasa Tsuboi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 17/036,169

(22) Filed: Sep. 29, 2020

(65) Prior Publication Data
US 2021/0111227 A1 Apr. 15, 2021

(30) Foreign Application Priority Data
Oct. 11, 2019 (JP) .............................. JP2019-188006

(51) Int. Cl.
*H01L 27/32* (2006.01)
*G09G 3/3233* (2016.01)
*H04N 5/225* (2006.01)

(52) U.S. Cl.
CPC ......... *H01L 27/326* (2013.01); *G09G 3/3233* (2013.01); *H01L 27/3262* (2013.01); *H01L 27/3276* (2013.01); *H04N 5/22525* (2018.08); *G09G 2300/0426* (2013.01); *G09G 2300/0439* (2013.01); *G09G 2300/0809* (2013.01); *G09G 2320/0233* (2013.01)

(58) Field of Classification Search
CPC .......... G09G 3/30; G09G 3/32; G09G 3/3208; G09G 3/3216; G09G 3/3225; G09G 3/3233; G09G 3/3241; G09G 3/325; G09G 3/3258; G09G 3/3291; G09G 2300/0439; G09G 2300/0809
USPC ...................................... 345/76–83
See application file for complete search history.

(56) References Cited

U.S. PATENT DOCUMENTS

| 8,952,374 B2 | 2/2015 | Jinta et al. |
| 10,818,232 B2 | 10/2020 | Tsuboi et al. |
| 2005/0219170 A1* | 10/2005 | Seki ...................... G09G 3/3258 345/77 |
| 2006/0017393 A1* | 1/2006 | Kang .................. H01L 27/3276 315/169.3 |

(Continued)

FOREIGN PATENT DOCUMENTS

JP 2014-186258 A 10/2014

*Primary Examiner* — Alexander Eisen
*Assistant Examiner* — Nelson Lam
(74) *Attorney, Agent, or Firm* — Venable LLP

(57) ABSTRACT

A light emitting device comprising a plurality of pixels is provided. Each of the plurality of pixels includes a light emitting element, a first transistor having a drain region connected to the light emitting element, and a second transistor having a drain region connected to a gate electrode of the first transistor. The plurality of pixels include a first pixel and a second pixel, which are adjacent to each other in a first direction. A source region of the second transistor of the first pixel and a source region of the second transistor of the second pixel share one diffusion region, and a source region, a gate electrode, and the drain region of the first transistor of the first and second pixels are sequentially arranged in one of a positive direction and a negative direction in the first direction.

24 Claims, 24 Drawing Sheets

(56) References Cited

U.S. PATENT DOCUMENTS

| | | | |
|---|---|---|---|
| 2006/0066229 A1* | 3/2006 | Nimura | H01L 27/3267 313/506 |
| 2011/0242072 A1* | 10/2011 | Ota | G09G 3/3233 345/204 |
| 2014/0223395 A1* | 8/2014 | Moroz | H01L 27/0207 716/54 |
| 2014/0284570 A1 | 9/2014 | Jinta et al. | |
| 2014/0285411 A1* | 9/2014 | Tamura | G09G 3/2092 345/82 |
| 2014/0320482 A1* | 10/2014 | Kawanaka | G09G 3/3659 345/100 |
| 2015/0294622 A1* | 10/2015 | Chaji | G09G 3/3291 345/80 |
| 2017/0200911 A1* | 7/2017 | Morimoto | H05B 33/12 |
| 2017/0317082 A1* | 11/2017 | Den Hartog | H01L 29/41725 |
| 2019/0355311 A1 | 11/2019 | Ota et al. | |
| 2020/0126481 A1 | 4/2020 | Tsuboi | |
| 2020/0135826 A1* | 4/2020 | Tsuboi | H01L 29/78621 |
| 2020/0143741 A1 | 5/2020 | Tsuboi et al. | |
| 2021/0005142 A1 | 1/2021 | Tsuboi et al. | |
| 2021/0242292 A1* | 8/2021 | Tsuboi | H04N 5/22525 |
| 2021/0384280 A1* | 12/2021 | Akiyama | G06F 1/1601 |
| 2022/0172679 A1* | 6/2022 | Akiyama | G09G 3/3233 |
| 2022/0173190 A1* | 6/2022 | Tsuboi | H01L 27/3276 |

* cited by examiner

LIGHT EMITTING DEVICE FOR DISPLAY DEVICE MINIATURIZING PIXELS AND SUPPRESSING DEGRADATION IN IMAGE QUALITY

BACKGROUND OF THE INVENTION

Field of the Invention

The present invention relates to a light emitting device, a display device, a photoelectric conversion device, an electronic device, an illumination device, and a mobile device.

Description of the Related Art

There is known a light emitting device in which pixels each including a light emitting element such as an organic EL (electroluminescence) element that emits light with luminance corresponding to a current flowing through the element are arranged. In Japanese Patent Laid-Open No. 2014-186258, FIG. 38 shows a state in which write transistors WSTr of two pixels adjacent to each other in a row direction are connected to the same data line DTL arranged in a column direction.

If transistors are formed in a circuit arrangement described in Japanese Patent Laid-Open No. 2014-186258, a diffusion region forming the main terminals, connected to the data line, of the write transistors of the two pixels is shared, and thus miniaturization of pixel is possible. As miniaturization of pixel advances, the influence when the positional relationship between a diffusion region and a gate electrode deviates due to alignment accuracy of a mask pattern at the time of forming transistors or the like may become large. If the positional relationship between the diffusion region and the gate electrode deviates among pixels, the electrical characteristic may change in a driving transistor for causing the light emitting element to emit light with luminance corresponding to luminance information, thereby degrading display image quality. The positional relationship between the diffusion region and the gate electrode may deviate in the same direction among transistors formed with the same exposure.

SUMMARY OF THE INVENTION

Some embodiments of the present invention provide a technique advantageous in miniaturizing pixels and suppressing degradation in image quality in a light emitting device.

According to some embodiments, a light emitting device comprising a plurality of pixels arranged on a substrate in an array in a first direction and a second direction intersecting the first direction, wherein each of the plurality of pixels includes a light emitting element, a first transistor having a drain region connected to an anode of the light emitting element, and a second transistor having a drain region connected to a gate electrode of the first transistor, the plurality of pixels include a first pixel and a second pixel, which are adjacent to each other in the first direction, a source region of the second transistor of the first pixel and a source region of the second transistor of the second pixel share one diffusion region, and a source region, a gate electrode, and the drain region of the first transistor of the first pixel and a source region, a gate electrode, and the drain region of the first transistor of the second pixel are sequentially arranged in one of a positive direction and a negative direction in the first direction, is provided.

Further features of the present invention will become apparent from the following description of exemplary embodiments (with reference to the attached drawings).

DESCRIPTION OF THE EMBODIMENTS

Figure 1:
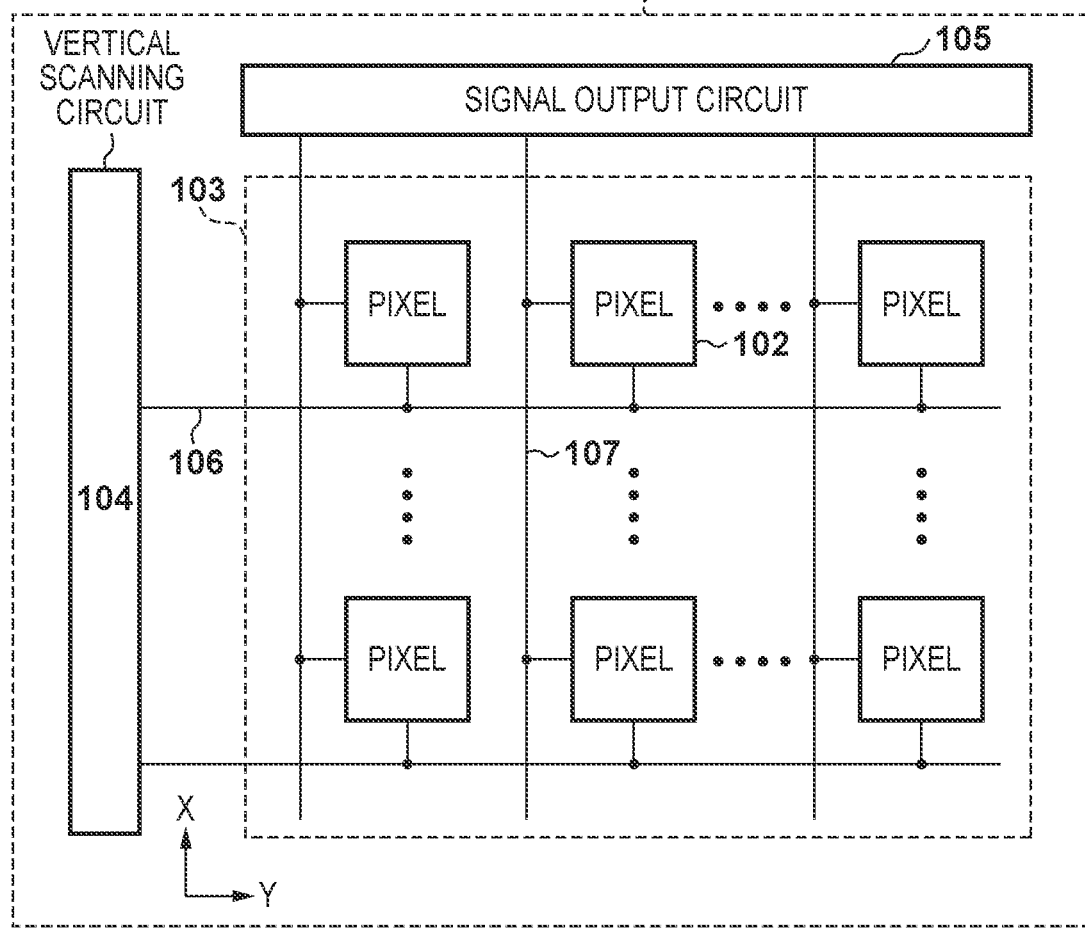
FIG. 1 is a view showing an example of the arrangement of a light emitting device according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 2:
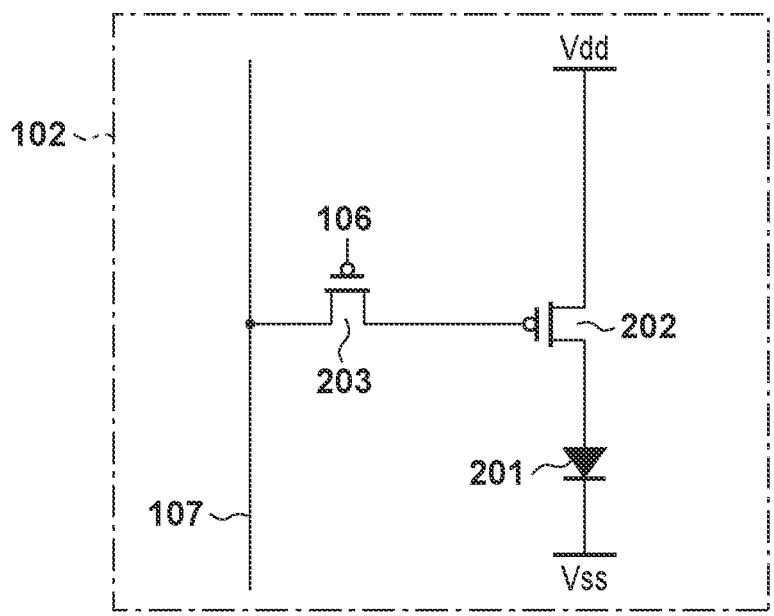
FIG. 2 is a circuit diagram showing an example of the arrangement of a pixel of the light emitting device shown in FIG. 1.
Figure 3:
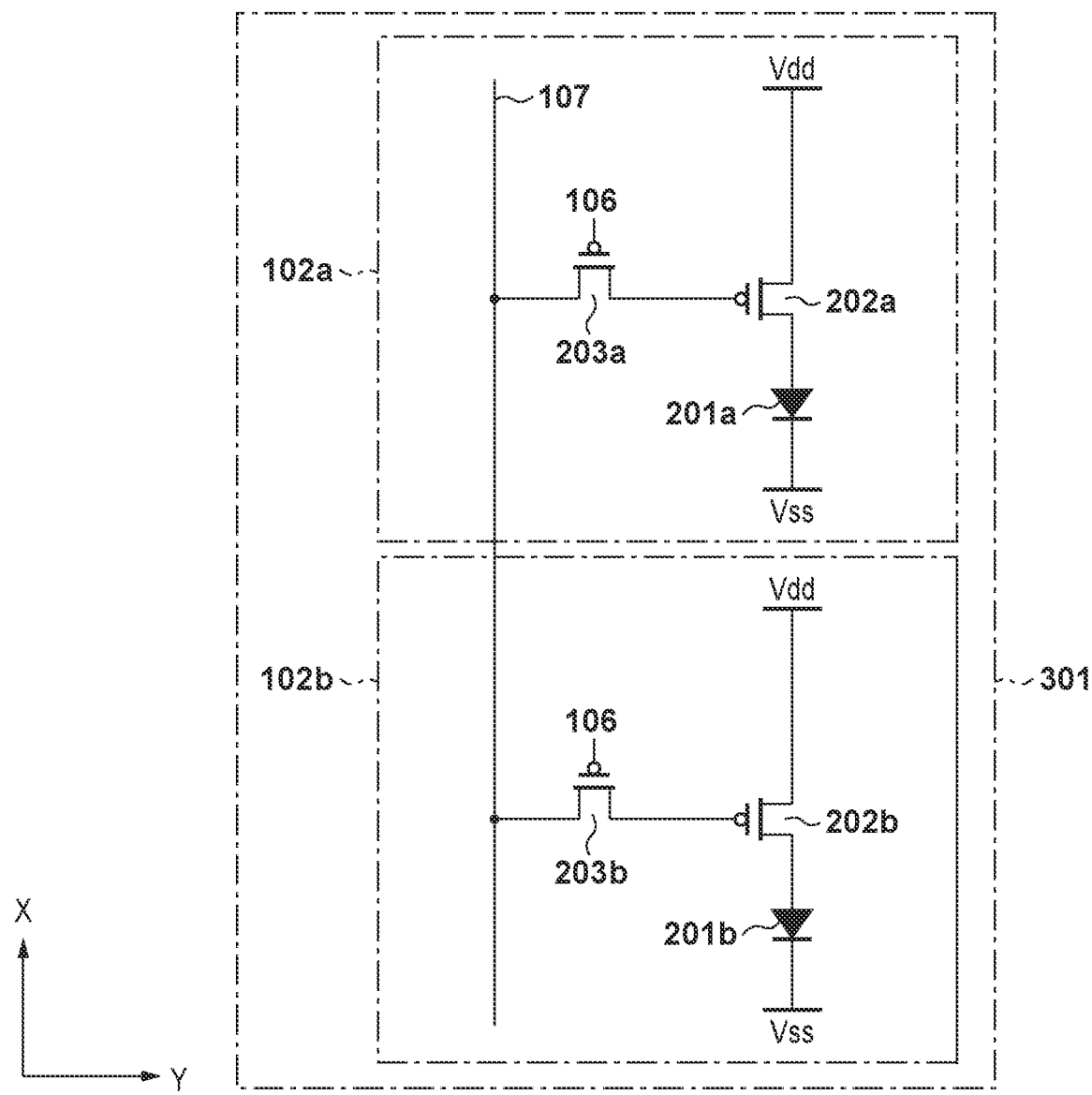
FIG. 3 is a circuit diagram showing an example of the arrangement of two pixels of the light emitting device shown in FIG. 1.

The structure of a light emitting device according to the first embodiment of the present invention will be described with reference to FIGS. 1 to 5. FIG. 1 is a view showing an example of the arrangement of a light emitting device 101 according to this embodiment. FIG. 2 is a circuit diagram showing an example of the arrangement of one pixel 102 of the light emitting device 101 shown in FIG. 1. FIG. 3 is a circuit diagram showing the connection relationship between two adjacent pixels 102.

In this specification, a case will be described in which a driving transistor 202 is connected to the anode of a light emitting element 201 and all transistors arranged in the pixel 102 are p-type transistors. However, the arrangement of the light emitting device 101 is not limited to this. The polarity of the light emitting element 201 and the conductivity types of the transistors arranged in the pixel 102 may all be reversed. Alternatively, for example, the driving transistor 202 may be a p-type transistor and the remaining transistors may be n-type transistors. Supplied potentials and connection are changed appropriately in accordance with the polarity and conductive types so that the light emitting element 201 emits light in a predetermined light amount. Therefore, for example, the "drain region" and "source region" of each transistor may be reversed.

As shown in FIG. 1, an organic EL light emitting device as an example of the light emitting device 101 includes a pixel array portion 103 and a driving unit arranged in the periphery of the pixel array portion 103. In the pixel array portion 103, the plurality of pixels 102 are arranged on a substrate in an array in an X direction and a Y direction intersecting the X direction, as shown in FIG. 1. As shown in FIG. 1, the X and Y directions may be orthogonal to each other. As shown in FIG. 2, each pixel 102 includes the light emitting element 201. The light emitting element 201 includes an organic layer with a light emitting layer between the anode and the cathode. The organic layer may appropriately include one or more of a hole injection layer, a hole transport layer, an electron injection layer, and an electron transport layer in addition to the light emitting layer.

The driving unit is a circuit for driving each pixel 102. For example, the driving unit includes a vertical scanning circuit 104 and a signal output circuit 105. In the pixel array portion 103, a scanning line 106 is arranged for each pixel row in a row direction (the Y direction in FIG. 1). In the pixel array portion 103, a signal line 107 is arranged for each pixel column in a column direction (the X direction in FIG. 1). Each scanning line 106 is connected to the output terminal of a corresponding row of the vertical scanning circuit 104. Each signal line 107 is connected to the output terminal of a corresponding column of the signal output circuit 105. The vertical scanning circuit 104 supplies a write control signal to the scanning line 106 at the time of writing a video signal in each pixel 102 of the pixel array portion 103. The signal output circuit 105 outputs a luminance signal with a voltage corresponding to luminance information.

As shown in FIG. 2, each pixel 102 includes the light emitting element 201, the driving transistor 202, and a write transistor 203. More specifically, one (a drain region in the arrangement shown in FIG. 2) of the two main terminals of the driving transistor 202 is connected to the anode of the two electrodes of the light emitting element 201. The other (a source region in the arrangement shown in FIG. 2) of the two main terminals of the driving transistor 202 is connected to a power supply potential Vdd. The cathode of the two electrodes of the light emitting element 201 is connected to a power supply potential Vss. The power supply potential Vss may be, for example, a ground potential. The main terminal of the transistor indicates a diffusion region functioning as the source or drain region of the transistor. The control terminal of the transistor indicates the gate electrode of the transistor.

One (a drain region in the arrangement shown in FIG. 2) of the two main terminals of the write transistor 203 is connected to the control terminal (gate electrode) of the driving transistor 202. The other (a source region in the arrangement shown in FIG. 2) of the two main terminals of the write transistor 203 is connected to the signal line 107. The gate electrode of the write transistor 203 is connected to the scanning line 106.

The total number of transistors, the total number of capacitive elements (to be described later), and a combination of the conductivity types of the transistors are merely examples, and the present invention is not limited to this arrangement. In the following description, when a transistor is connected between elements A and B, one of the main terminals of the transistor is connected to element A and the other of the main terminals of the transistor is connected to element B. That is, when a transistor is connected between elements A and B, a case in which the control terminal of the transistor is connected to element A, one of the main terminals is not connected to element A, and the other of the main terminals is not connected to element B is excluded.

The driving transistor 202 supplies a current from the power supply potential Vdd to the light emitting element 201, thereby causing the light emitting element 201 to emit light. More specifically, the driving transistor 202 supplies a current corresponding to the signal voltage of the signal line 107 to the light emitting element 201. This current-drives the light emitting element 201 to emit light.

The write transistor 203 is rendered conductive in response to a write control signal applied to the gate electrode of the write transistor 203 from the vertical scanning circuit 104 via the scanning line 106. Thus, the write transistor 203 writes, in the pixel 102, the signal voltage of a video signal corresponding to luminance information supplied from the signal output circuit 105 via the signal line 107. The written signal voltage is applied to the gate electrode of the driving transistor 202.

An organic EL (Organic Electroluminescent) element can be used as the light emitting element 201. When the light emitting element 201 emits light, the amount of a current flowing through the driving transistor 202 changes in accordance with the signal voltage applied to the gate electrode of the driving transistor 202 from the signal line 107 via the write transistor 203. This charges the capacitance between the anode and the cathode of the light emitting element 201 to a predetermined potential, and a current corresponding to the potential difference flows. Thus, the light emitting element 201 emits light with predetermined luminance.

Next, the two adjacent pixels 102 will be described with reference to FIG. 3. As shown in FIG. 3, the plurality of pixels 102 arranged in the pixel array portion 103 include pixels 102a and 102b adjacent to each other in the X direction. When indicating a specific one of the pixels 102, a suffix such as "a" or "b" is appended to a reference numeral like "pixel 102"a"". When any pixel is possible without specifying it, "pixel 102" is simply used. The same applies to the remaining components.

The pixel 102a includes a light emitting element 201a, a driving transistor 202a, and a write transistor 203a. The pixel 102b includes a light emitting element 201b, a driving transistor 202b, and a write transistor 203b. The source region of the write transistor 203a of the pixel 102a and the source region of the write transistor 203b of the pixel 102b are connected via the signal line 107. In this way, the two pixels 102a and 102b in which the source regions of the write transistors 203 are connected to each other form one pixel group 301.

Figure 4:
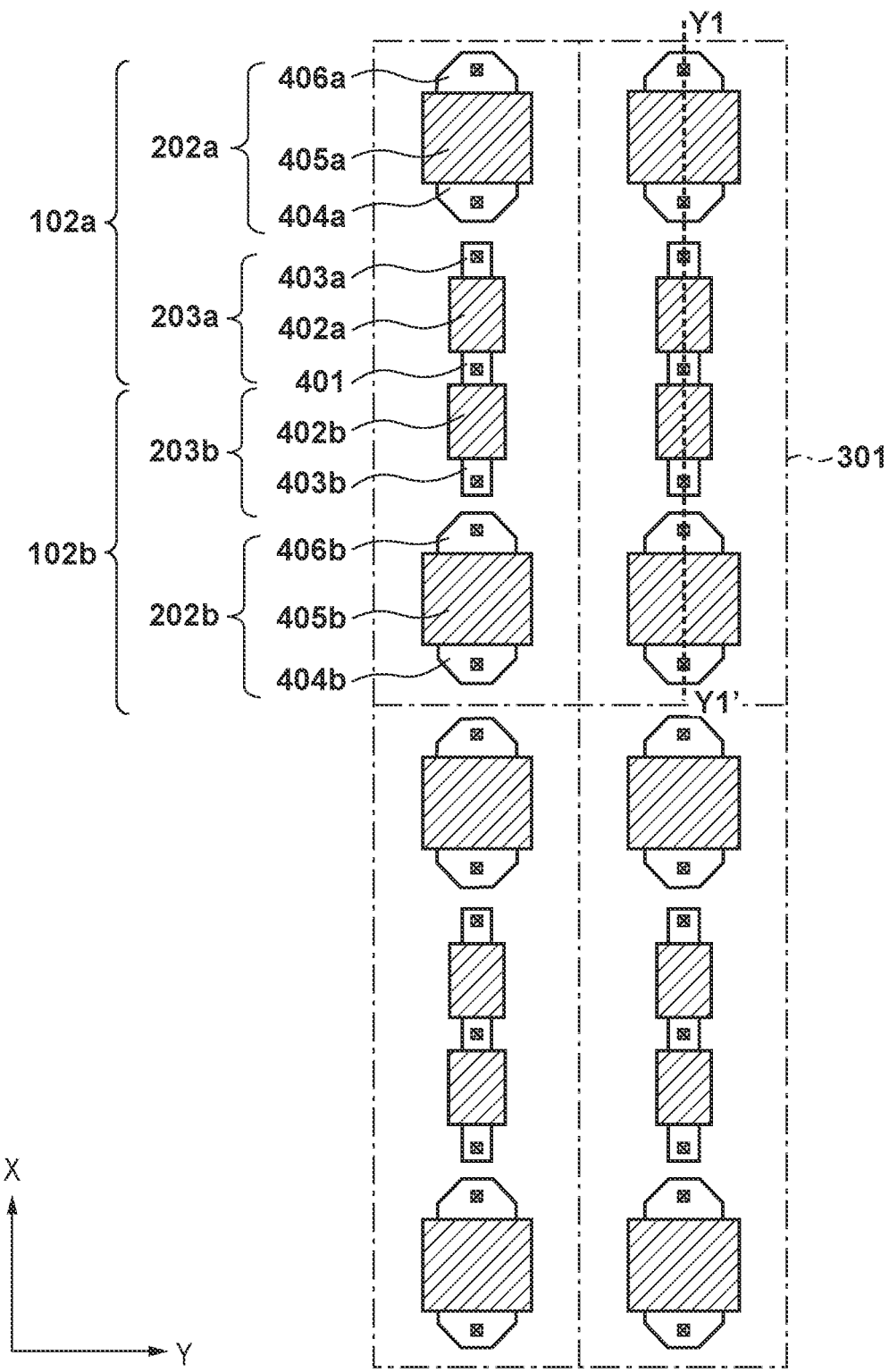
FIG. 4 is a plan view showing an example of the arrangement of the pixels shown in FIG. 3.

FIG. 4 shows an example of the arrangement of the transistors of the circuit shown in FIG. 3. FIG. 4 shows four pixel groups 301 each formed by the pixels 102a and 102b. In each pixel group 301, the write transistor 203a of the pixel 102a and the write transistor 203b of the pixel 102b are arranged between the driving transistor 202a of the pixel 102a and the driving transistor 202b of the pixel 102b.

The write transistor 203a includes a p-type diffusion region 401, a gate electrode 402a, and a p-type diffusion region 403a. The write transistor 203b includes the p-type diffusion region 401, a gate electrode 402b, and a p-type diffusion region 403b. As shown in FIG. 4, the write transistors 203a and 203b share the diffusion region 401 connected to the signal line 107. In other words, the source region of the write transistor 203a of the pixel 102a and the source region of the write transistor 203b of the pixel 102b share one diffusion region 401. This makes it possible to miniaturize the pixels 102 (pixel groups 301), as compared with a case in which a diffusion region forming the source region of the write transistor 203a and a diffusion region forming the source region of the write transistor 203b are separately arranged in the X direction.

The driving transistor 202a of the pixel 102a includes a p-type diffusion region 404a, a gate electrode 405a, and a p-type diffusion region 406a. The diffusion region 404a is connected to the power supply potential Vdd to function as the source region of the driving transistor 202a. The diffusion region 406a is connected to the anode of the light emitting element 201a to function as the drain region of the driving transistor 202a. The driving transistor 202b of the pixel 102b includes a p-type diffusion region 404b, a gate electrode 405b, and a p-type diffusion region 406b. The diffusion region 404b is connected to the power supply potential Vdd to function as the source region of the driving transistor 202b. The diffusion region 406b is connected to the anode of the light emitting element 201b to function as the drain region of the driving transistor 202b.

As described above, the source region (diffusion region 404a), the gate electrode 405a, and the drain region (diffusion region 406a) of the driving transistor 202a of the pixel 102a and the source region (diffusion region 404b), the gate electrode 405b, and the drain region (diffusion region 406b) of the driving transistor 202b of the pixel 102b are sequentially arranged in the positive X direction. That is, a direction in which a current flows from the power supply potential Vdd to the power supply potential Vss through the driving transistor 202 and the light emitting element 201 is the same between the pixels 102a and 102b. The positive direction corresponds to a direction indicated by an arrow as the X direction in FIG. 4. Although the source region, gate electrode, and drain region of each of the driving transistors 202a and 202b of the pixels 102a and 102b are sequentially arranged in the positive X direction in FIG. 4, the present invention is not limited to this. For example, the source region, gate electrode, and drain region of each of the driving transistors 202a and 202b may be arranged in the negative X direction.

As miniaturization of the pixel 102 (pixel group 301) advances, the positional relationship between the diffusion region and the gate electrode may deviate from design due to alignment accuracy of a mask pattern at the time of forming the pixel. If the positional relationship between the diffusion region and the gate electrode deviates, the electrical characteristic of the formed transistor may change from a design value. In addition, as transistor miniaturizing advances, the influence when the positional relationship between the diffusion region and the gate electrode deviates may become conspicuous. The positional relationship between the diffusion region and the gate electrode may deviate in the same direction among transistors formed with the same exposure. At this time, consider a case in which currents flow in the opposite directions in the driving transistor 202a of the pixel 102a and the driving transistor 202b of the pixel 102b. In this case, since the positional relationship between the diffusion region and the gate electrode deviates in the same direction, if a current larger than a design value flows through the driving transistor 202a, a current flowing through the driving transistor 202b may become smaller than a design value. Therefore, a luminance unevenness may occur between the pixels 102a and 102b, thereby degrading the display image quality.

On the other hand, in this embodiment, the directions of currents for causing the light emitting elements 201 to emit light, which flow through the driving transistor 202a of the pixel 102a and the driving transistor 202b of the pixel 102b, are the same. Therefore, if a current larger than the design value flows through the driving transistor 202a, a current larger than the design value also flows through the driving transistor 202b. Thus, in the light emitting device 101 according to this embodiment, a difference in electrical characteristic of the driving transistor 202 between the pixels 102 can be reduced, thereby suppressing degradation in display image quality. For example, in all the pixels 102 arranged in the pixel array portion 103 of the light emitting device 101, the source regions, gate electrodes, and drain regions of the driving transistors 202 may be arranged in the same direction.

Figure 5:
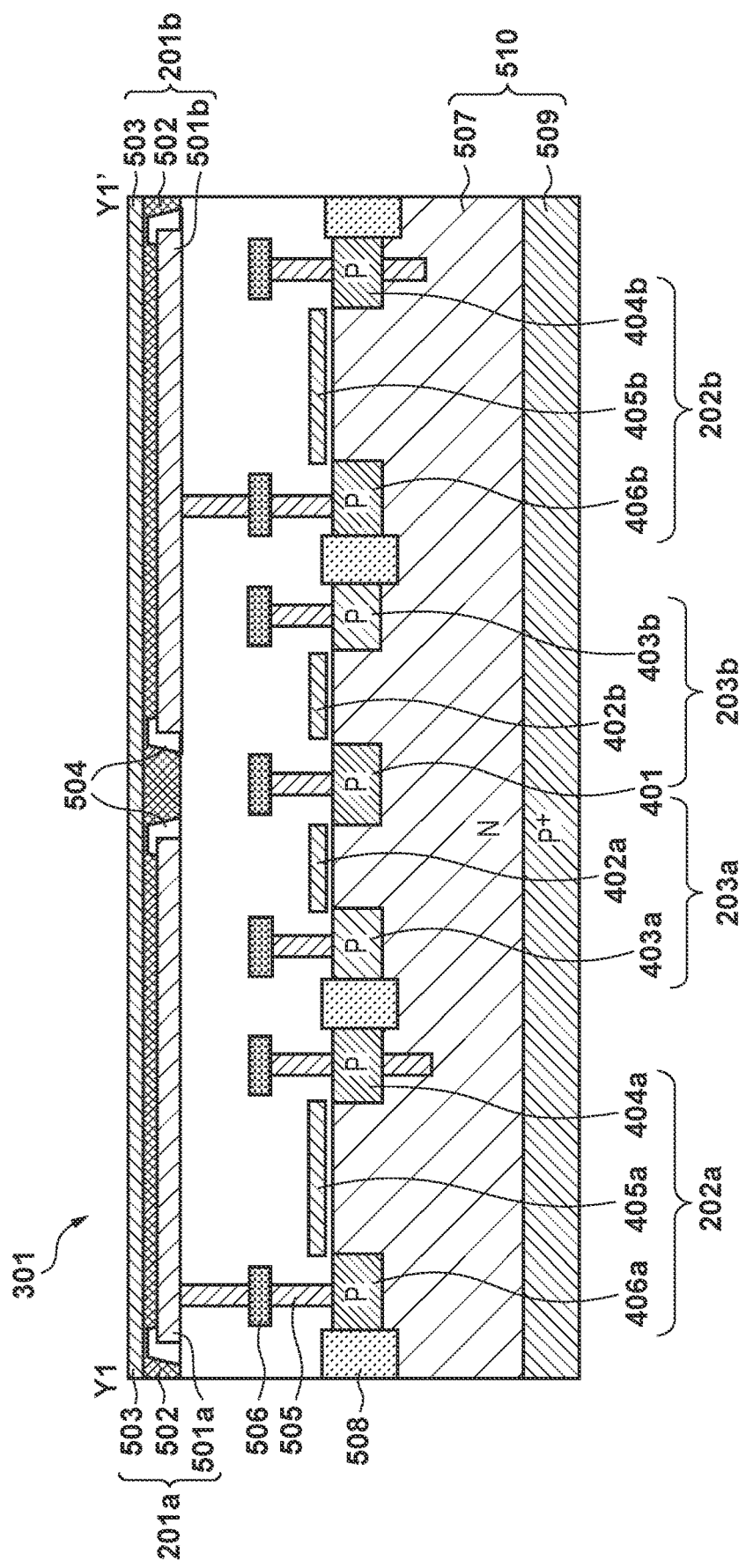
FIG. 5 is a sectional view showing an example of the arrangement of the pixels shown in FIG. 4.

FIG. 5 is a sectional view of the pixel group 301 shown in FIG. 4, which is taken along a line Y1-Y1'. The light emitting element 201 includes an electrode 501 (to also be referred to as a lower electrode hereinafter), an organic layer 502 including a light emitting layer, and an electrode 503 (to also be referred to as an upper electrode hereinafter). The electrode 501 is arranged for each light emitting element 201. As shown in FIG. 5, an electrode 501a is arranged in the light emitting element 201a, and an electrode 501b is arranged in the light emitting element 201b. The organic layer 502 and the electrode 503 can be shared by the plurality of light emitting elements 201. For example, the light emitting element 201 of all the pixels 102 arranged in the pixel array portion 103 may share the organic layer 502 and the electrode 503.

As shown in FIG. 5, a bank portion 504 may be arranged in an end portion of the electrode 501. The bank portion 504 can be arranged to surround the outer circumference of the electrode 501. The bank portion 504 can reduce leakage of a current flowing between the electrode 501a and the electrode 503 into the adjacent pixel 102. The electrode 501 and the diffusion region 406 functioning as the source region of the driving transistor 202 are connected via a via 505 and a wiring layer 506.

Each transistor described above is formed on a substrate 510. The substrate 510 can be a semiconductor substrate of, for example, p-type doped silicon. An n-type well layer 507 is arranged on a p-type semiconductor layer 509 of the substrate 510, and the diffusion regions 401, 403, 404, and 406 are formed in the well layer 507. The well layer 507 is connected to the power supply potential Vdd. Each transistor is separated by an insulator isolation portion 508. The insulator isolation portion 508 electrically isolates each transistor by an appropriate method such as STI (Shallow Trench Isolation), LOCOS (Local Oxidation Of Silicon), or n-type diffusion region isolation.

FIG. 5 shows only one wiring layer 506 between the diffusion regions 401, 403, 404, and 406 and the layer in which the electrodes 501 are arranged. The present invention, however, is not limited to this, and a plurality of wiring layers may be arranged. In this case, the diffusion regions 401, 403, 404, and 406 may be respectively connected to wiring patterns arranged in different wiring layers or wiring patterns arranged in the same wiring layer.

The structure of a light emitting device according to the second embodiment of the present invention will be described with reference to FIGS. 6 to 13. In this embodiment, as compared with the above-described first embodiment, a light emission control transistor is connected between a power supply potential Vdd and a driving transistor 202. Components different from the above-described first embodiment will mainly be described below.

Figure 6:
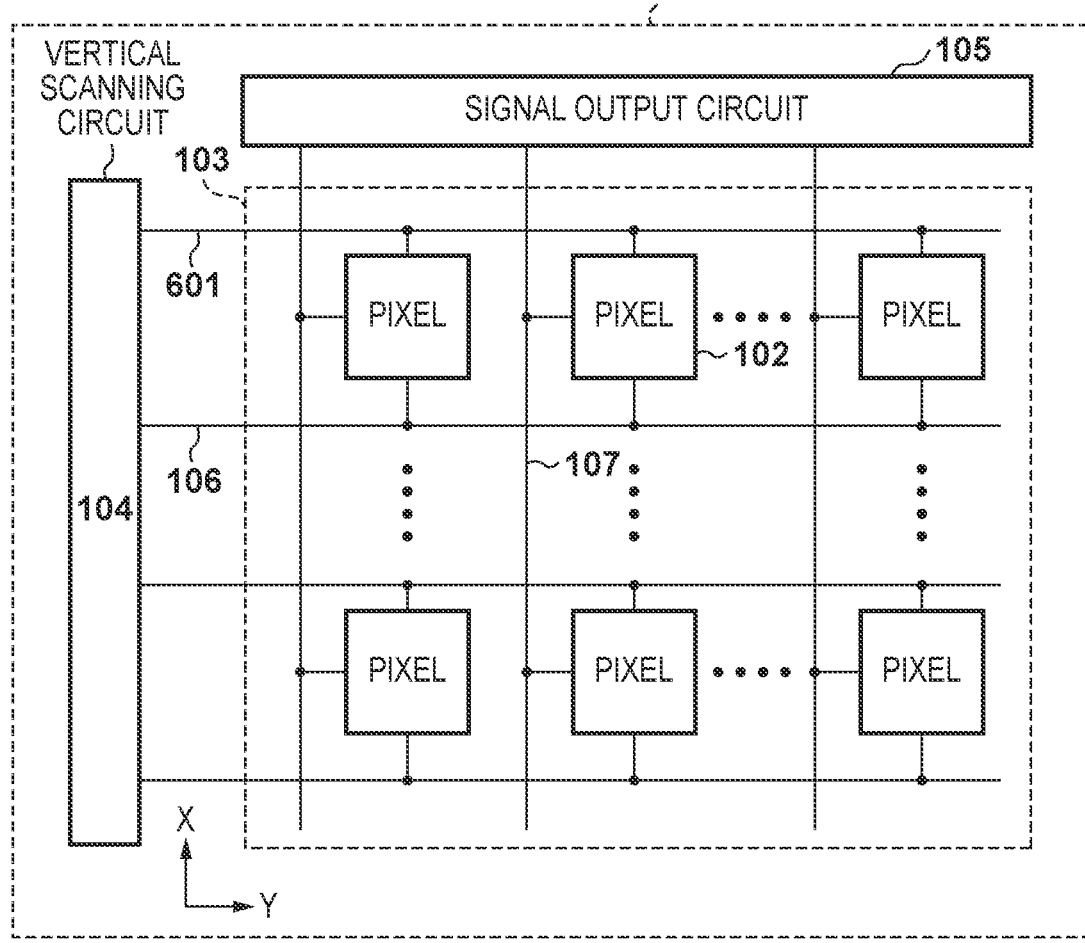
FIG. 6 is a view showing an example of the arrangement of a light emitting device according to another embodiment.

FIG. 6 is a view showing an example of the arrangement of a light emitting device 101 according to this embodiment. As shown in FIG. 6, in a pixel array portion 103, a scanning line 601 is arranged for each pixel row in the Y direction in addition to the above-described first embodiment. Each scanning line 601 is connected to the output terminal of a corresponding row of a vertical scanning circuit 104, and supplies a light emission control signal to each pixel 102.

Figure 7:
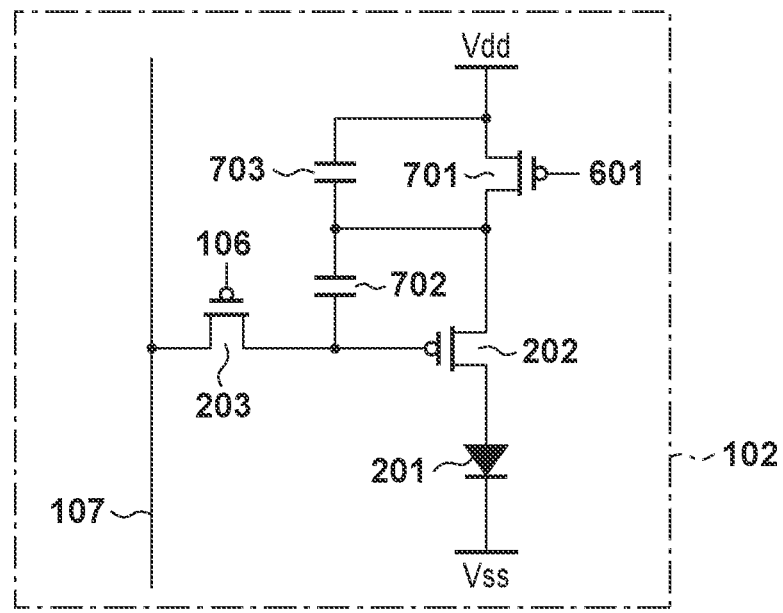
FIG. 7 is a circuit diagram showing an example of the arrangement of a pixel of the light emitting device shown in FIG. 6.

FIG. 7 is a circuit diagram showing an example of the arrangement of one pixel 102 of the light emitting device 101 shown in FIG. 6. As shown in FIG. 7, a light emission control transistor 701 is connected between the power supply potential Vdd and the driving transistor 202 in addition to the above-described first embodiment. One (a drain region in the arrangement shown in FIG. 7) of the two main terminals of the light emission control transistor 701 is connected to one (a source region in the arrangement shown in FIG. 7) of the two main terminals of the driving transistor 202. The other (a source region in the arrangement shown in FIG. 7) of the two main terminals of the light emission control transistor 701 is connected to the power supply potential Vdd. The control terminal (gate electrode) of the light emission control transistor 701 is connected to the scanning line 601. Furthermore, a capacitive element 702 is connected between the gate electrode and the source electrode of the driving transistor 202, and a capacitive element 703 is connected between the power supply potential Vdd and the source electrode of the driving transistor 202.

The light emission control transistor 701 is rendered conductive in response to the light emission control signal applied from the vertical scanning circuit 104 to the gate electrode via the scanning line 601, thereby allowing a current to be supplied from the power supply potential Vdd to the driving transistor 202. This allows the driving transistor 202 to drive a light emitting element 201. That is, by controlling the conductive state of the current path, the light emission control transistor 701 functions as a switch element that controls light emission or non-light emission of the light emitting element 201.

As described above, a switching operation of the light emission control transistor 701 can provide a period (non-emission period) during which the light emitting element 201 is in a non-emission state, and control the ratio between the non-emission period and an emission period during which the light-emitting element 201 emits light (so-called duty control). This duty control can reduce afterimage blurring accompanying light emission from the light emitting element 201 of each pixel 102 over a period of one frame, and further improve the image quality of a moving image in particular.

Figure 8:
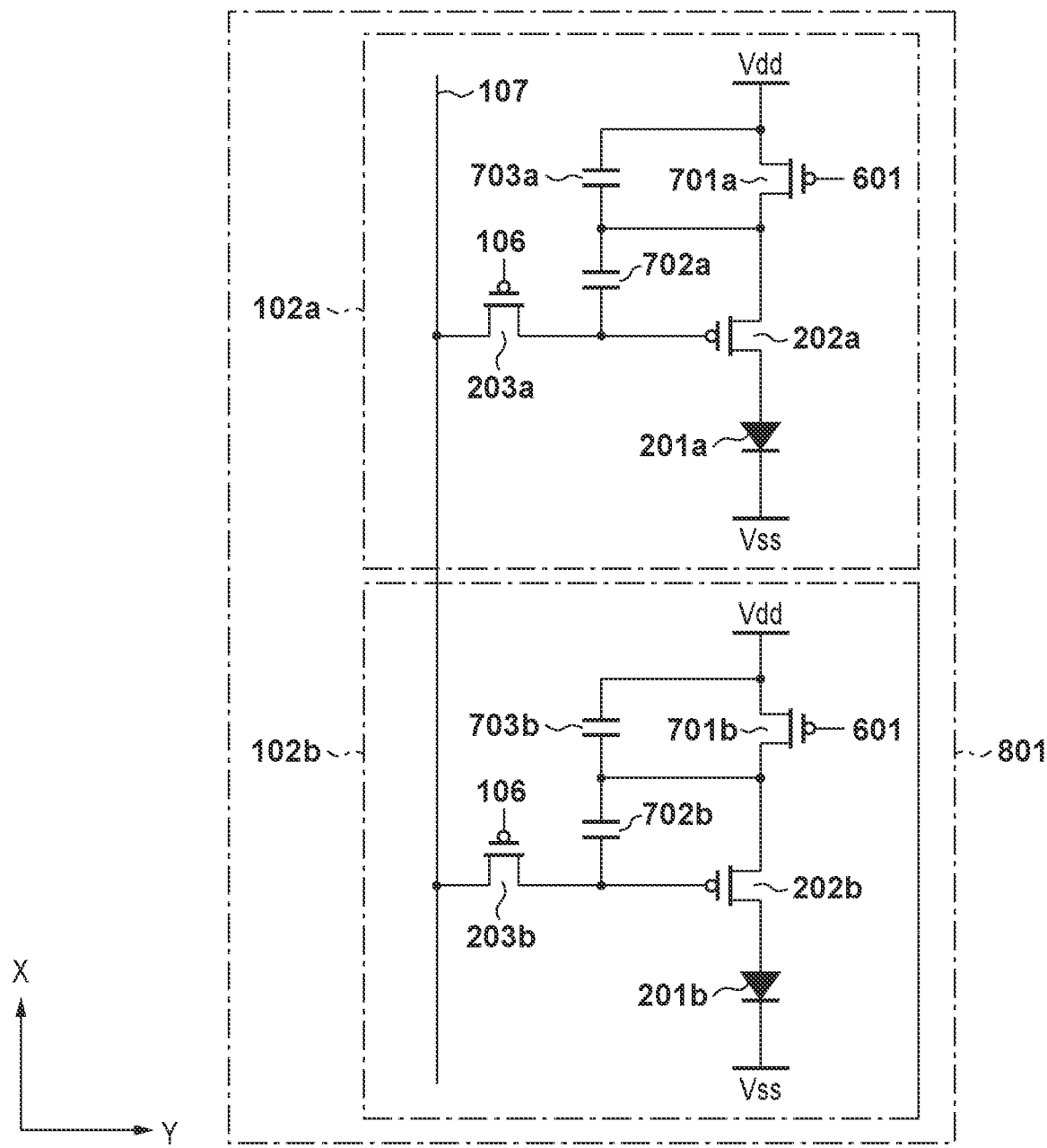
FIG. 8 is a circuit diagram showing an example of the arrangement of two pixels of the light emitting device shown in FIG. 6.

FIG. 8 is a circuit diagram showing the connection relationship between two adjacent pixels 102. As shown in FIG. 8, the plurality of pixels 102 arranged in the pixel array portion 103 include pixels 102a and 102b adjacent to each other in the X direction. Similar to the above-described first embodiment, the source region of a write transistor 203a of the pixel 102a and the source region of a write transistor 203b of the pixel 102b are connected via the signal line 107 to form one pixel group 801. The pixel 102a includes a light emission control transistor 701a, a capacitive element 702a, and a capacitive element 703a, in addition to the pixel 102a according to the first embodiment. The pixel 102b includes a light emission control transistor 701b, a capacitive element 702b, and a capacitive element 703b, in addition to the pixel 102b according to the first embodiment.

Figure 9:
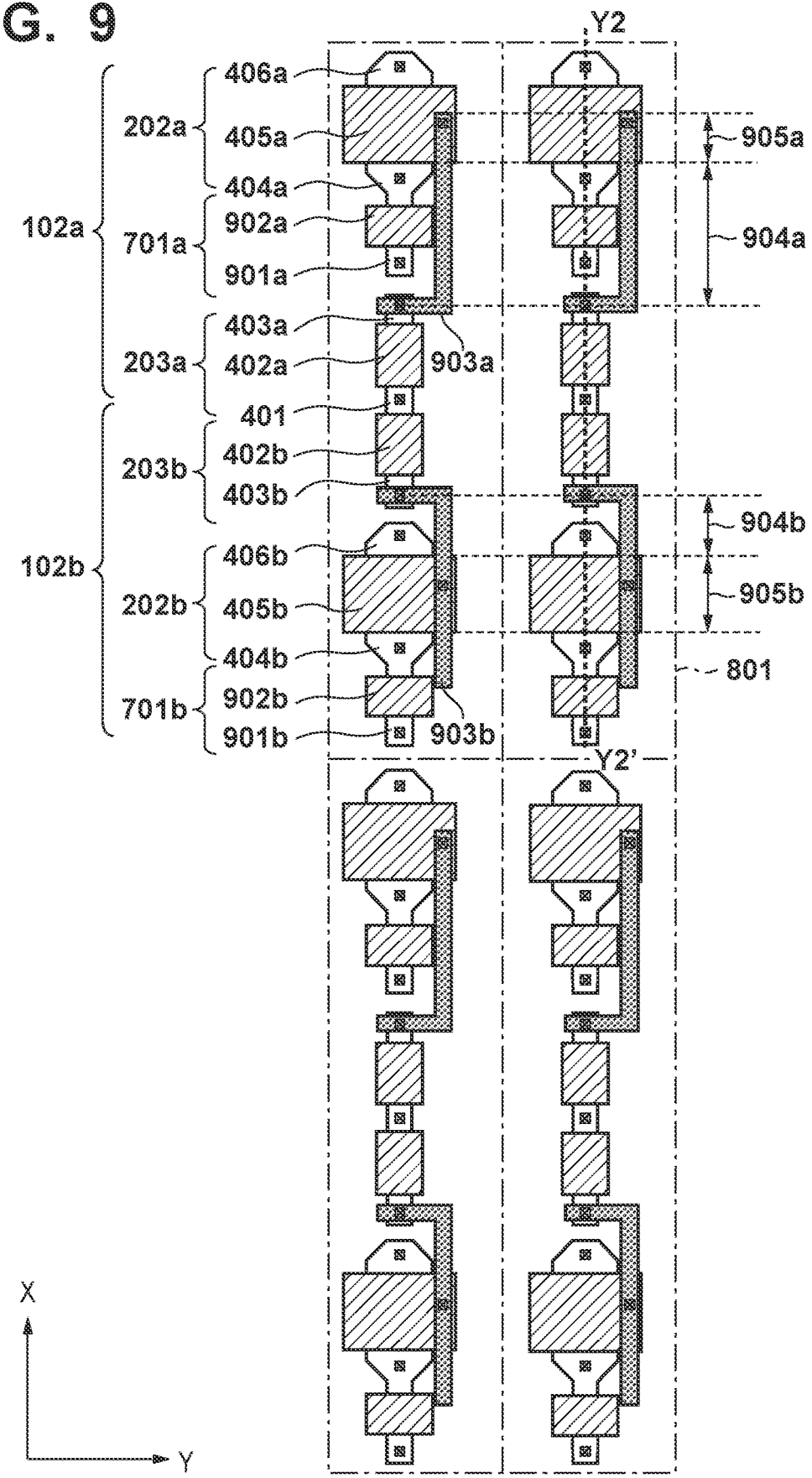
FIG. 9 is a plan view showing an example of the arrangement of the pixels shown in FIG. 8.

FIG. 9 shows an example of the arrangement of the transistors of the circuit shown in FIG. 8. FIG. 9 shows four pixel groups 801 each formed by the pixels 102a and 102b. In each pixel group 801, the write transistor 203a of the pixel 102a and the write transistor 203b of the pixel 102b are arranged between a driving transistor 202a of the pixel 102a and a driving transistor 202b of the pixel 102b. In addition, the light emission control transistor 701a of the pixel 102a is arranged between the driving transistor 202a and the write transistor 203a of the pixel 102a in the X direction. The light emission control transistor 701b of the pixel 102b is arranged on the side, opposite to the pixel 102a, of the driving transistor 202b of the pixel 102b in the X direction.

As shown in FIG. 9, the light emission control transistor 701a includes a p-type diffusion region 901a, a gate electrode 902a, and a p-type diffusion region 404a. The diffusion region 901a is connected to the power supply potential Vdd to function as the source region of the light emission control transistor 701a. The drain region of the light emission control transistor 701a and the source region of the driving transistor 202a share one diffusion region 404a. This can miniaturize the pixel 102 (pixel group 801), as compared with a case in which the diffusion region forming the drain region of the light emission control transistor 701a and the diffusion region forming the source region of the driving transistor 202a are separately arranged in the X direction.

Similarly, the light emission control transistor 701b includes a p-type diffusion region 901b, a gate electrode 902b, and a p-type diffusion region 404b. The diffusion region 901b is connected to the power supply potential Vdd to function as the source region of the light emission control transistor 701b. The drain region of the light emission control transistor 701b and the source region of the driving transistor 202b share one diffusion region 404b.

In this embodiment as well, the source region (diffusion region 404a), a gate electrode 405a, and the drain region (diffusion region 406a) of the driving transistor 202a of the pixel 102a and the source region (diffusion region 404b), a gate electrode 405b, and the drain region (diffusion region 406b) of the driving transistor 202b of the pixel 102b are sequentially arranged in the positive X direction. Thus, similar to the above-described first embodiment, in the light emitting device 101, a difference in electrical characteristic of the driving transistor 202 between the pixels 102 can be reduced, thereby suppressing degradation in display image quality. Furthermore, in this embodiment, the source region (diffusion region 901a), the gate electrode 902a, the drain region (diffusion region 404a) of the light emission control transistor 701a of the pixel 102a and the source region (diffusion region 901b), the gate electrode 902b, and the drain region (diffusion region 404b) of the light emission control transistor 701b of the pixel 102b are sequentially arranged in the positive X direction. Thus, in the light emitting device 101, a difference in electrical characteristic of the light emission control transistor 701 between the pixels 102 can be reduced, thereby suppressing degradation in display image quality. As shown in FIG. 9, in the pixel 102, the arrangement order of the source region, gate electrode, and drain region of the driving transistor 202 in the positive X direction may be the same as that of the source region, gate electrode, and drain region of the light emission control transistor 701. For example, with respect to each of the light emission control transistors 701a and 701b, the source region, gate electrode, and drain region may be arranged in this order in the negative X direction.

In this embodiment, the light emission control transistor 701a of the pixel 102a and the light emission control transistor 701b of the pixel 102b are arranged so that currents flow in the same direction. However, the present invention is not limited to this, and currents need not flow in the same direction. For example, the light emission control transistor 701a arranged in the pixel 102a and the light emission control transistor 701b arranged in the pixel 102b may be designed so that currents flow in the opposite directions. This is implemented when the driving transistor 202 causes a current to flow in response to a luminance signal with a voltage corresponding to luminance information while the light emission control transistor 701 controls light emission or non-light emission of the light emitting element 201. Thus, the control accuracy of the light emission control transistor 701 may be lower than that of the driving transistor 202. Therefore, in accordance with the arrangement of the pixels 102 and the pixel groups 801, the flow direction of a current in each light emission control transistor 701 may be decided appropriately.

Next, a wiring pattern 903 for connecting the gate electrode 405 of the driving transistor 202 and the diffusion region 403 forming the drain region of the write transistor will be described. In the above-described first embodiment, as shown in FIG. 4, the distance between the gate electrode 405 of the driving transistor 202 and the diffusion region 403 forming the drain region of the write transistor is almost the same. Therefore, the length of the wiring pattern 903 is almost the same between the pixels 102a and 102b, and the parasitic capacitance of the wiring pattern 903 is almost the same between the pixels 102a and 102b. On the other hand, in the arrangement shown in FIG. 9, the distance between the gate electrode 405 of the driving transistor 202 and the diffusion region 403 forming the drain region of the write transistor is different between the pixels 102a and 102b. A wiring pattern indicates a conductor wiring for electrically connecting two or more target objects. A wiring of the same shape need not always be used repeatedly.

A wiring pattern 903a is a wiring pattern for connecting the gate electrode 405a of the driving transistor 202a and the diffusion region 403a forming the drain region of the write transistor 203a. A wiring pattern 903b is a wiring pattern for connecting the gate electrode 405b of the driving transistor 202b and the diffusion region 403b forming the drain region of the write transistor 203b. A length 904a is a length between the gate electrode 405a of the driving transistor 202a and the contact portion of the diffusion region 403a forming the drain region of the write transistor 203a. Similarly, a length 904b is a length between the gate electrode 405b of the driving transistor 202b and the contact portion of the diffusion region 403b forming the drain region of the write transistor 203b. A length 905a is the length of a portion where the wiring pattern 903a overlaps the gate electrode 405a of the driving transistor 202a. Similarly, a length 905b is the length of a portion where the wiring pattern 903b overlaps the gate electrode 405b of the driving transistor 202b.

In the arrangement shown in FIG. 9, the length 904a of the pixel 102a is longer than the length 904b of the pixel 102b. To the contrary, the length 905a of the pixel 102a is shorter than the length 905b of the pixel 102b. This can increase the parasitic capacitance of the wiring pattern 903b to be almost equal to the parasitic capacitance of the wiring pattern 903a. As a result, the gate-source capacitance of the driving transistor 202a for holding a voltage corresponding to luminance information is almost equal to that of the driving transistor 202b, thereby reducing the difference in electrical characteristic between the pixels 102a and 102b. This can reduce a luminance unevenness between the pixels 102a and 102b, thereby suppressing degradation in display image quality.

In the arrangement shown in FIG. 9, the length 904a is longer than the length 904b, and thus the length 905a is shorter than the length 905b. However, if the length 904a is shorter than the length 904b, the length 905a is made longer than the length 905b. As shown in FIG. 9, the wiring pattern 903 is arranged in the X direction on the gate electrode 405. However, the wiring pattern 903 may be arranged to bend from the X direction to the Y direction. Furthermore, as shown in FIG. 9, the wiring pattern 903b may extend from the gate electrode 405b on the side opposite to the pixel 102a.

Figure 10:
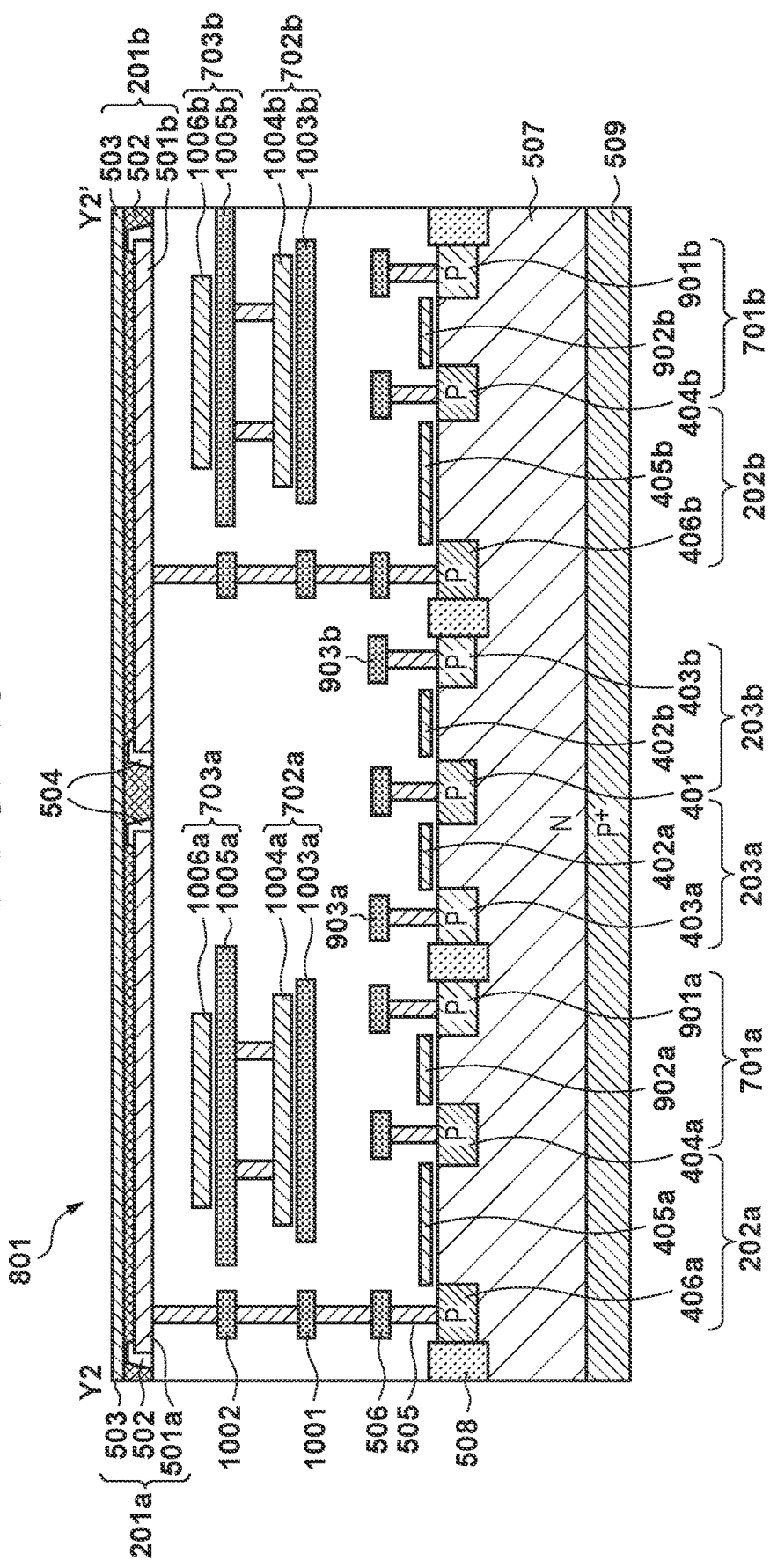
FIG. 10 is a sectional view showing an example of the arrangement of the pixels shown in FIG. 9.

FIG. 10 is a sectional view of the pixel group 801 shown in FIG. 9, which is taken along a line Y2-Y2'. As shown in FIG. 10, an electrode 501 and a diffusion region 406 forming the source region of the driving transistor 202 are connected via a via 505 and wiring layers 506, 1001, and 1002. The capacitive element 702 has a structure that includes an insulating layer between an electrode 1003 arranged in the wiring layer 1001 and an electrode 1004. The capacitive element 703 has a structure that includes an insulating film between an electrode 1005 arranged in the wiring layer 1002 and an electrode 1006. However, the arrangement of the pixel group 801 is not limited to this. For example, a wiring layer may be arranged in addition to the wiring layers 506, 1001, and 1002, a wiring layer including the electrode 1004, and a wiring layer including the electrode 1006. The arrangements of the capacitive elements 702 and 703 are not limited to them, and an electrode may be formed in another wiring layer.

Figure 11:
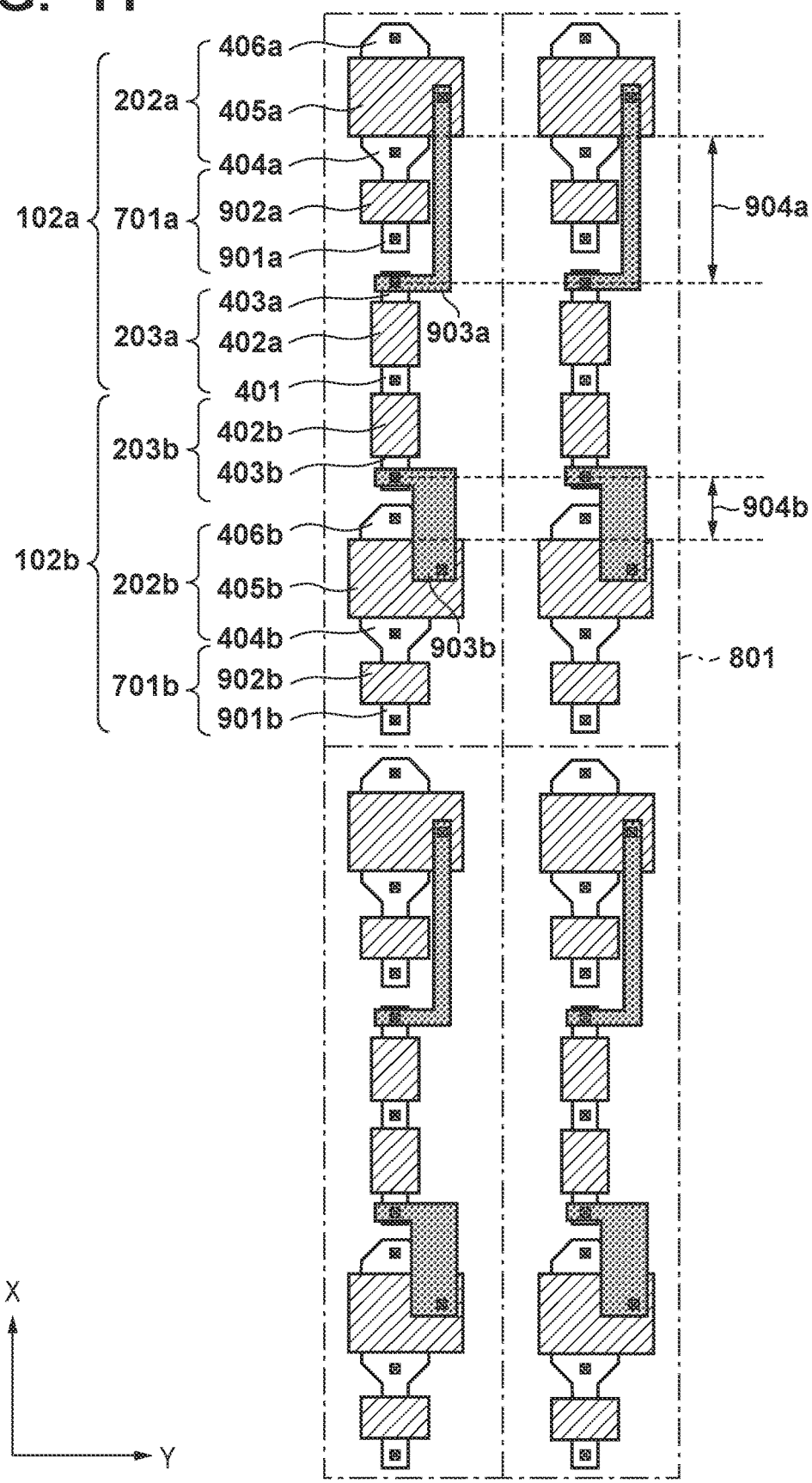
FIG. 11 is a plan view showing a modification of the pixels shown in FIG. 9.

FIG. 11 shows a modification of the wiring pattern 903 shown in FIG. 9. As described above, the length 904a of the pixel 102a is longer than the length 904b of the pixel 102b. To the contrary, in the arrangement shown in FIG. 11, an area in the pixel 102a where the wiring pattern 903a overlaps the gate electrode 405a of the driving transistor 202a is smaller than an area in the pixel 102b where the wiring pattern 903b overlaps the gate electrode 405b of the driving transistor 202b. To implement this, the width of a portion, extending in the X direction, of the wiring pattern 903a of the pixel 102a may be smaller than the width of a portion, extending in the X direction, of the wiring pattern 903b of the pixel 102b.

This can increase the parasitic capacitance of the wiring pattern 903b to be almost equal to the parasitic capacitance of the wiring pattern 903a. As a result, the gate-source capacitance of the driving transistor 202a for holding a voltage corresponding to luminance information is almost equal to that of the driving transistor 202b, thereby reducing the difference in electrical characteristic between the pixels 102a and 102b. Thus, in the arrangement shown in FIG. 11 as well, it is possible to reduce a luminance unevenness between the pixels 102a and 102b, thereby suppressing degradation in display image quality.

In the arrangement shown in FIG. 11, since the length 904a is longer than the length 904b, an area where the wiring pattern 903a and the gate electrode 405a overlap each other is smaller than an area where the wiring pattern 903b and the gate electrode 405b overlap each other. On the other hand, if the length 904a is shorter than the length 904b, the area where the wiring pattern 903a and the gate electrode 405a overlap each other is made larger than the area where the wiring pattern 903b and the gate electrode 405b overlap each other. In this case, the width of a portion, extending in the X direction, of the wiring pattern 903a of the pixel 102a may be larger than that of a portion, extending in the X direction, of the wiring pattern 903b of the pixel 102b.

Figure 12:
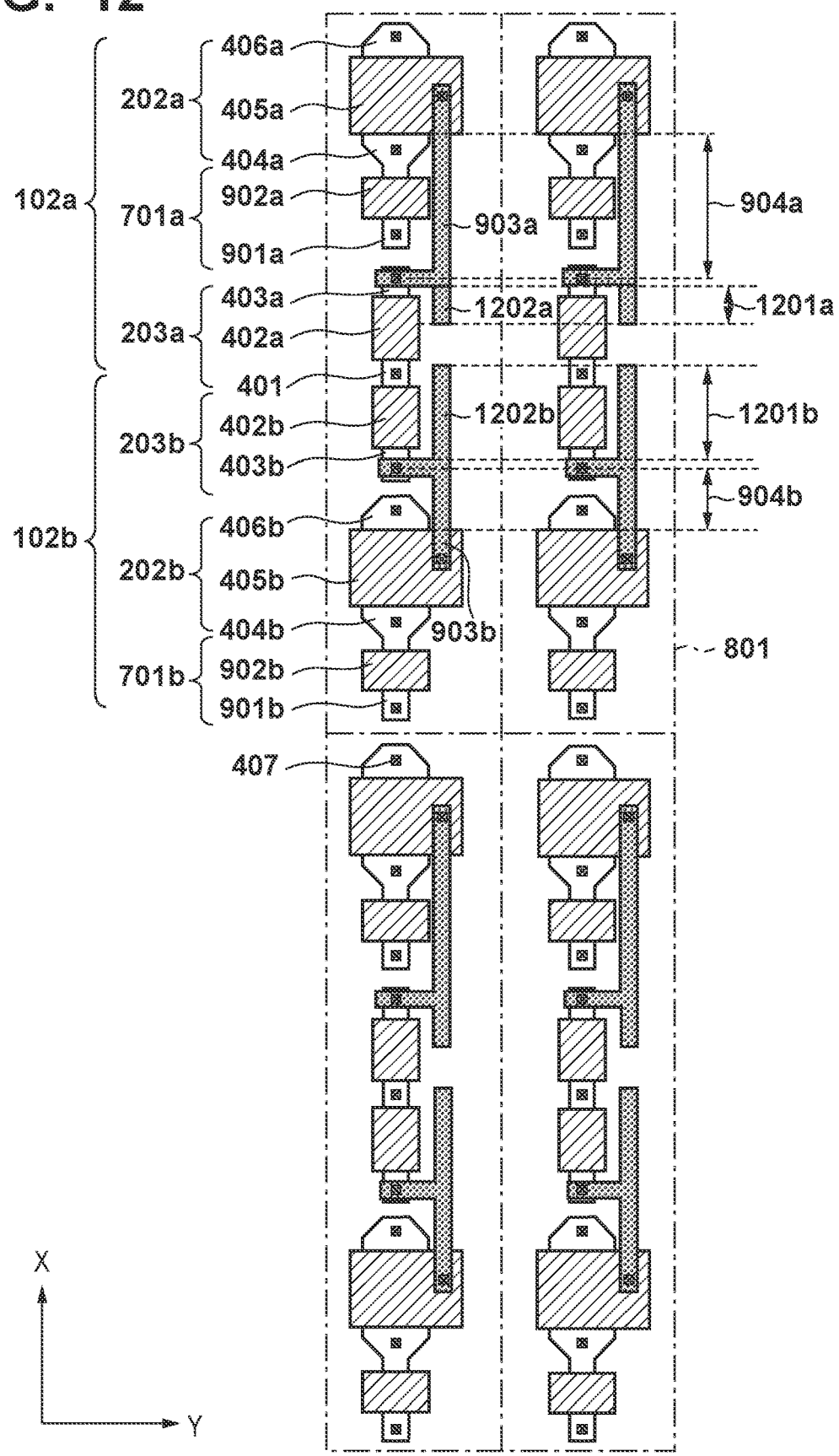
FIG. 12 is a plan view showing a modification of the pixels shown in FIG. 9.

FIG. 12 shows another modification of the wiring pattern 903 shown in FIG. 9 or 11. The portion, extending in the X direction, of the wiring pattern 903a of the pixel 102a includes a portion 1202a of a length 1201a arranged on the side of the pixel 102b with respect to a portion extending in the Y direction. Similarly, the portion, extending in the X direction, of the wiring pattern 903b of the pixel 102b includes a portion 1202b of a length 1201b arranged on the side of the pixel 102a with respect to a portion extending in the Y direction. As described above, the length 904a of the pixel 102a is longer than the length 904b of the pixel 102b. To the contrary, in the arrangement shown in FIG. 12, the length 1201a of the portion 1202a is shorter than the length 1201b of the portion 1202b.

This can increase the parasitic capacitance of the wiring pattern 903b to be almost equal to the parasitic capacitance of the wiring pattern 903a. As a result, the gate-source capacitance of the driving transistor 202a for holding a voltage corresponding to luminance information is almost equal to that of the driving transistor 202b, thereby reducing the difference in electrical characteristic between the pixels 102a and 102b. Thus, in the arrangement shown in FIG. 12 as well, it is possible to reduce a luminance unevenness between the pixels 102a and 102b, thereby suppressing degradation in display image quality.

In the arrangement shown in FIG. 12, since the length 904a is longer than the length 904b, the length 1201a is shorter than the length 1201b. However, if the length 904a is shorter than the length 904b, the length 1201a is made longer than the length 1201b. As shown in FIG. 12, the portion 1202 of the wiring pattern 903 extends in the X direction. The present invention, however, is not limited to this. The portion 1202 of the wiring pattern 903 may be arranged to bend from the X direction to the Y direction, or a portion extending in the Y direction of the wiring pattern 903 shown in FIG. 12 may be extended to one or both sides in the Y direction, and may be adjusted in length. For example, the portion extending in the Y direction of the wiring pattern 903 may protrude rightward in FIG. 12 from the portion extending in the X direction.

Figure 13:
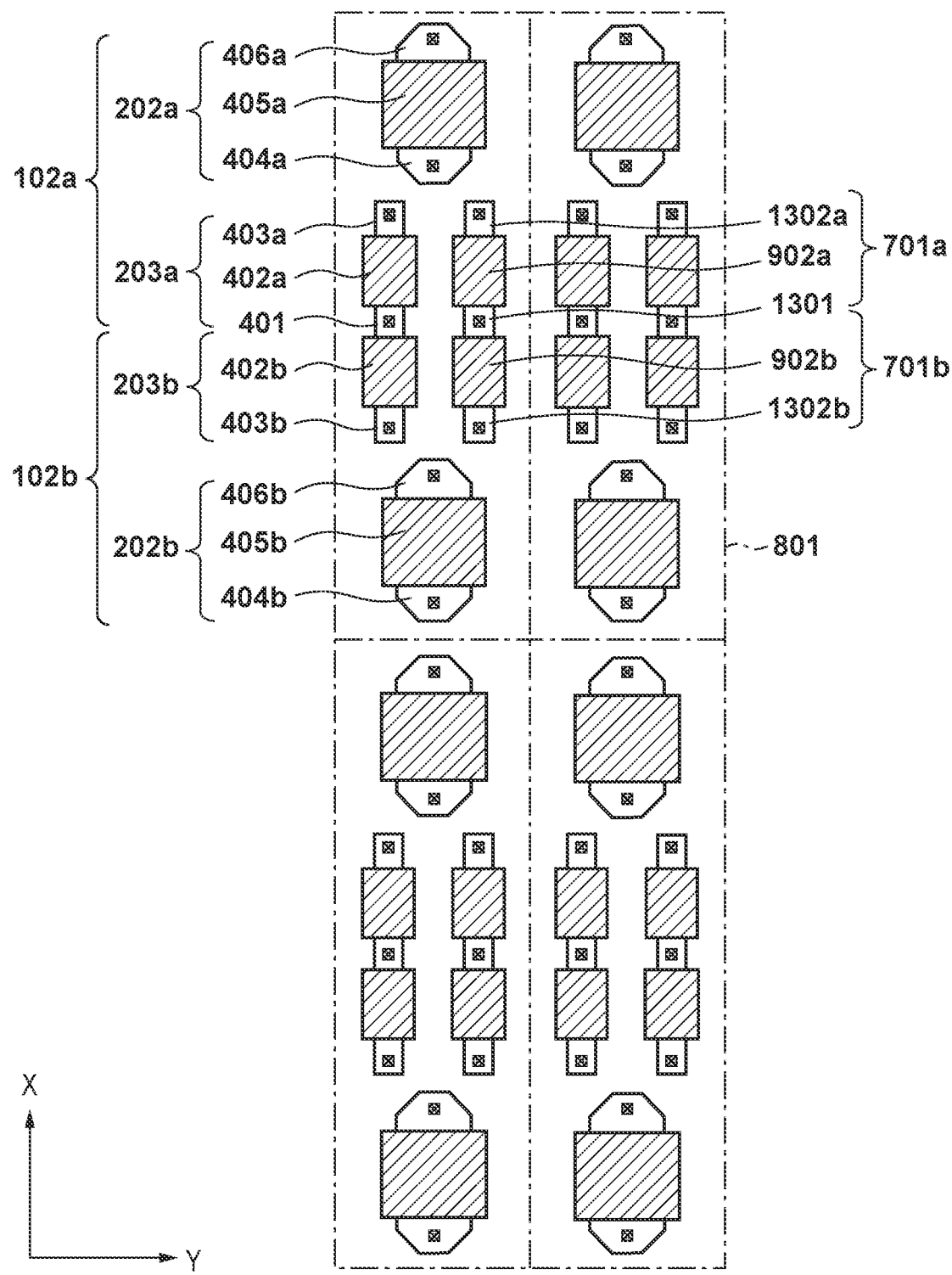
FIG. 13 is a plan view showing a modification of the pixels shown in FIG. 9.

FIG. 13 shows a modification of the arrangement of the transistors shown in FIG. 9. In each pixel group 801, the write transistor 203a of the pixel 102a and the write transistor 203b of the pixel 102b are arranged between the driving transistor 202a of the pixel 102a and the driving transistor 202b of the pixel 102b. Furthermore, the light emission control transistor 701a of the pixel 102a and the light emission control transistor 701b of the pixel 102b are arranged between the driving transistor 202a of the pixel 102a and the driving transistor 202b of the pixel 102b in the X direction. The source region of the light emission control transistor 701a of the pixel 102a and the source region of the light emission control transistor 701b of the pixel 102b share one diffusion region 1301. The write transistors 203a and 203b of the pixels 102a and 102b and the light emission control transistors 701a and 701b of the pixels 102a and 102b are arranged side by side in the Y direction. The write transistors 203a and 203b of the pixels 102a and 102b and the light emission control transistors 701a and 701b of the pixels 102a and 102b may be reversed, as compared with the arrangement shown in FIG. 13.

As shown in FIG. 13, the light emission control transistor 701a includes the p-type diffusion region 1301, a gate electrode 902a, and a p-type diffusion region 1302a. Similarly, the light emission control transistor 701b includes the p-type diffusion region 1301, a gate electrode 902b, and a p-type diffusion region 1302b. As shown in FIG. 13, the source region of the light emission control transistor 701a and the source region of the light emission control transistor 701b share one diffusion region 1301 connected to the power supply potential Vdd. This can miniaturize the pixels 102 (pixel groups 801), as compared with a case in which the diffusion region forming the source region of the light emission control transistor 701a and the diffusion region forming the source region of the light emission control transistor 701b are separately arranged in the X direction.

The structure of a light emitting device according to the third embodiment of the present invention will be described with reference to FIGS. 14 to 22. In this embodiment, as compared with the above-described first and second embodiments, a reset transistor is connected between the anode of a light emitting element 201 and a power supply potential Vss. Components different from the above-described first and second embodiments will mainly be described below.

Figure 14:
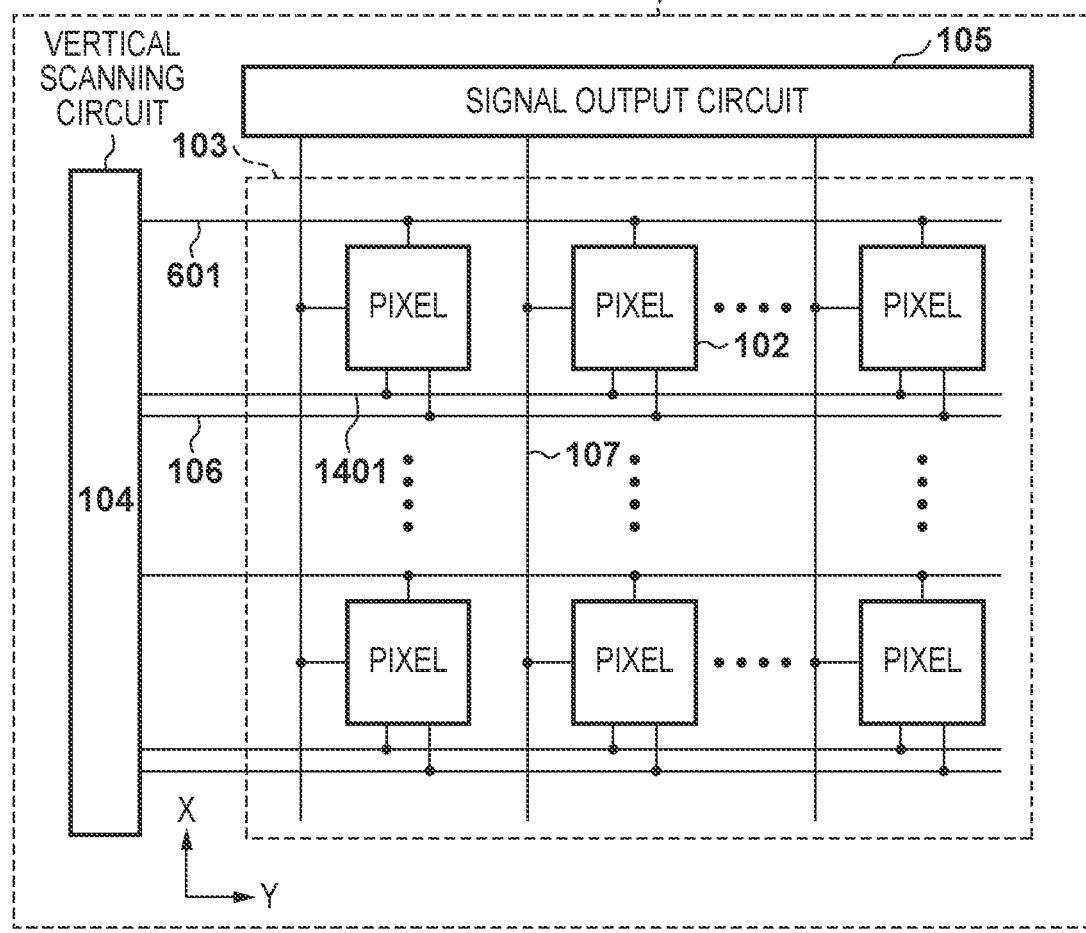
FIG. 14 is a view showing an example of the arrangement of a light emitting device according to still another embodiment.

FIG. 14 is a view showing an example of the arrangement of a light emitting device 101 according to this embodiment. As shown in FIG. 14, in a pixel array portion 103, a scanning line 1401 is arranged for each pixel row in the Y direction in addition to the above-described first and second embodiments. Each scanning line 1401 is connected to the output terminal of a corresponding row of a vertical scanning circuit 104, and supplies a reset signal to each pixel 102.

Figure 15:
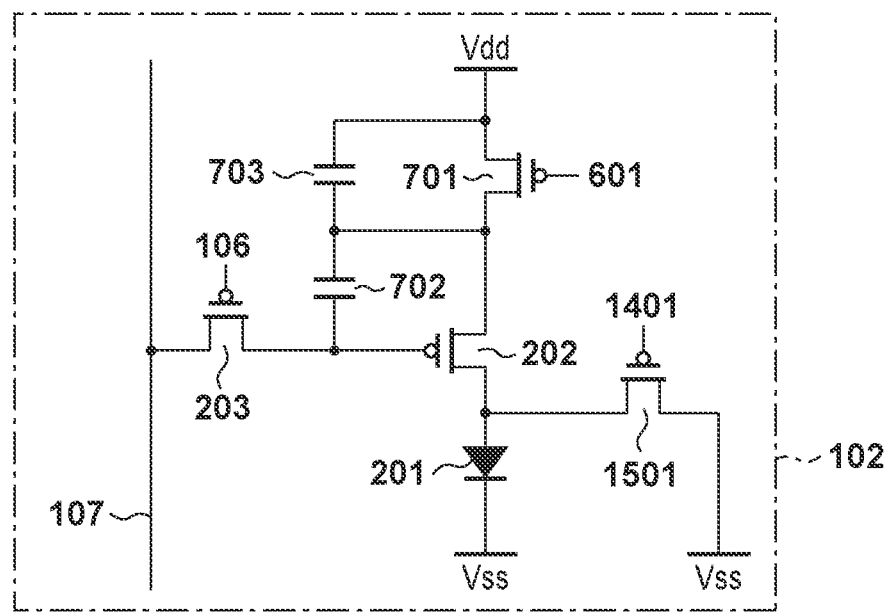
FIG. 15 is a circuit diagram showing an example of the arrangement of a pixel of the light emitting device shown in FIG. 14.

FIG. 15 is a circuit diagram showing an example of the arrangement of one pixel 102 of the light emitting device 101 shown in FIG. 14. As shown in FIG. 15, a reset transistor 1501 is connected between the anode of the light emitting element 201 (the drain of a driving transistor 202) and the power supply potential Vss, in addition to the above-described first and second embodiments. One (a source region in the arrangement shown in FIG. 15) of the two main terminals of the reset transistor 1501 is connected to the anode of the light emitting element 201 and one (a drain region in the arrangement shown in FIG. 15) of the main terminals of the driving transistor 202. The other (a drain region in the arrangement shown in FIG. 15) of the two main terminals of the reset transistor 1501 is connected to the power supply potential Vss. The control terminal (gate electrode) of the reset transistor 1501 is connected to the scanning line 1401. When the reset transistor 1501 is rendered conductive during a non-light emission period, the anode of the light emitting element 201 is connected to the power supply potential Vss to short-circuit the two terminals of the light emitting element 201. This can reset the light emitting element 201 (sets the light emitting element 201 in a non-light emission state) (reset operation). By providing the reset transistor 1501 in the pixel 102, the light emitting element 201 is caused to surely perform black display during the non-light emission period, thereby implementing the light emitting device 101 with a high contrast ratio. FIGS. 14 and 15 show the arrangement in which a light emission control transistor 701 is arranged. The present invention, however, is not limited to this. For example, the light emission control transistor 701 need not be arranged.

Figure 16:
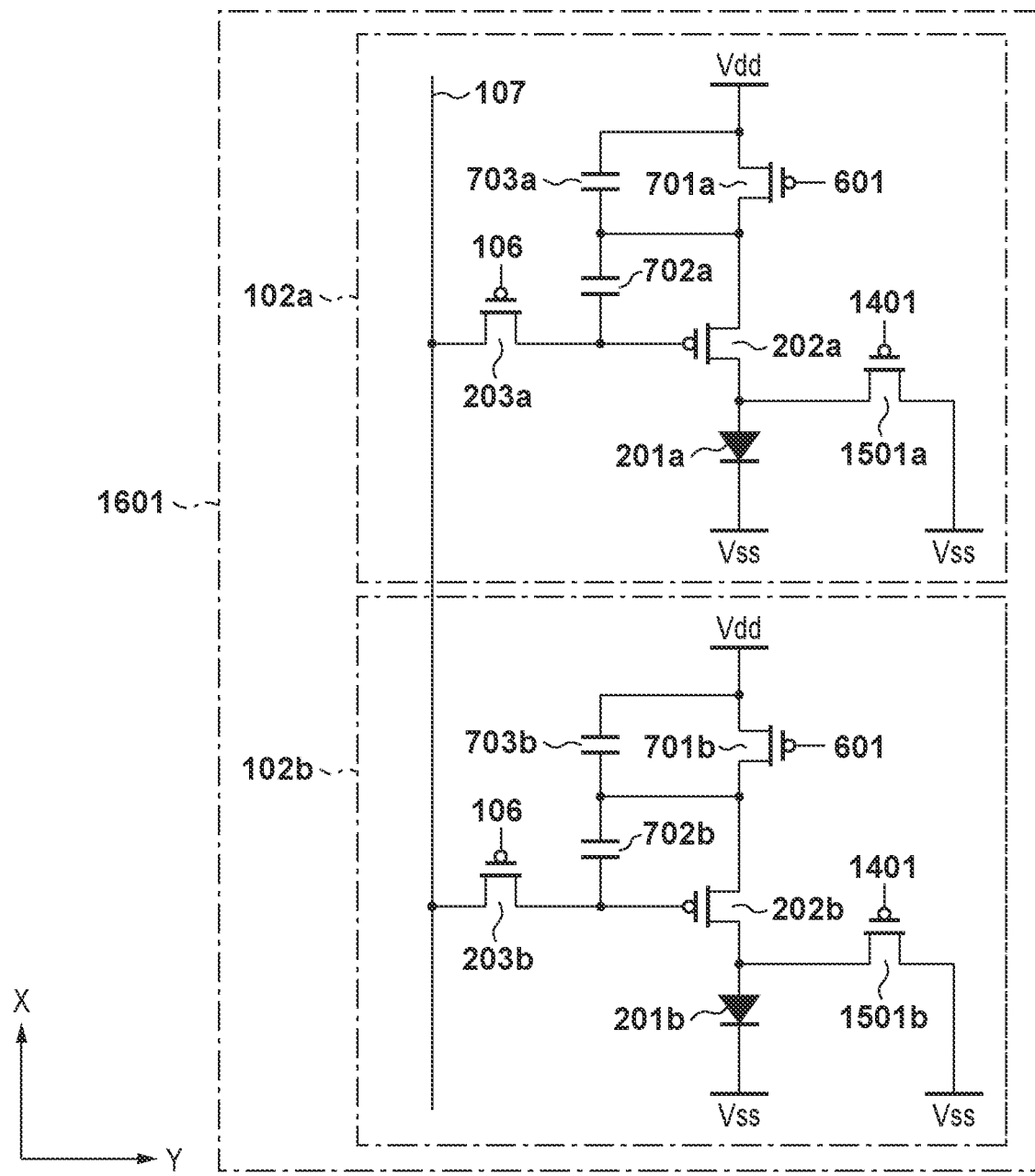
FIG. 16 is a circuit diagram showing an example of the arrangement of two pixels of the light emitting device shown in FIG. 14.

FIG. 16 is a circuit diagram showing the connection relationship between two adjacent pixels 102. As shown in FIG. 16, the plurality of pixels 102 arranged in the pixel array portion 103 include pixels 102a and 102b adjacent to each other in the X direction. Similar to the above-described first and second embodiments, the source region of a write transistor 203a of the pixel 102a and the source region of a write transistor 203b of the pixel 102b are connected via a signal line 107 to form one pixel group 1601. The pixel 102a includes a reset transistor 1501a, in addition to the pixel 102a according to the first or second embodiment. The pixel 102b includes a reset transistor 1501b, in addition to the pixel 102b according to the first or second embodiment.

Figure 17:
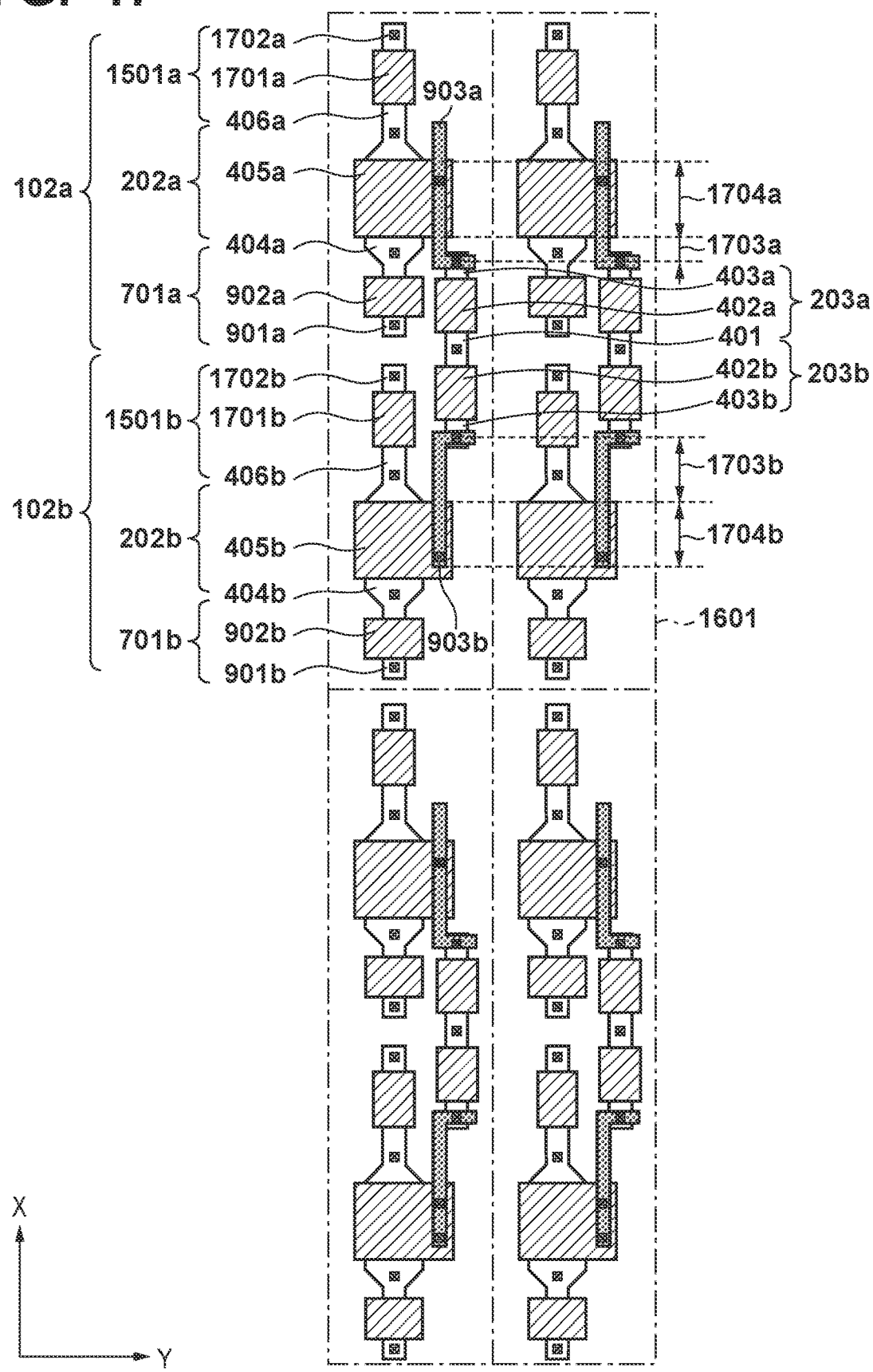
FIG. 17 is a plan view showing an example of the arrangement of the pixels shown in FIG. 16.

FIG. 17 shows an example of the arrangement of the transistors of the circuit shown in FIG. 16. FIG. 17 shows four pixel groups 1601 each formed by the pixels 102a and 102b. In each pixel group 1601, a write transistor 203a of the pixel 102a and a write transistor 203b of the pixel 102b are arranged between a driving transistor 202a of the pixel 102a and a driving transistor 202b of the pixel 102b. In addition, a light emission control transistor 701a of the pixel 102a and the reset transistor 1501b of the pixel 102b are arranged between the driving transistor 202a of the pixel 102a and the driving transistor 202b of the pixel 102b in the X direction. The reset transistor 1501a of the pixel 102a is arranged on the side, opposite to the pixel 102b, of the driving transistor 202a of the pixel 102a. The light emission control transistor 701b of the pixel 102b is arranged on the side, opposite to the pixel 102a, of the driving transistor 202b of the pixel 102b. In the arrangement shown in FIG. 17, the write transistors 203a and 203b of the pixels 102a and 102b and the light emission control transistor 701a of the pixel 102a and the reset transistor 1501b of the pixel 102b are arranged side by side in the Y direction. The write transistors 203a and 203b of the pixels 102a and 102b and the light emission control transistor 701a of the pixel 102a and the reset transistor 1501b of the pixel 102b may be reversed, as compared with the arrangement shown in FIG. 17.

As shown in FIG. 17, the reset transistor 1501a includes a p-type diffusion region 406a, a gate electrode 1701a, and a p-type diffusion region 1702a. The diffusion region 1702a is connected to the power supply potential Vss to function as the drain region of the reset transistor 1501a. The source region of the reset transistor 1501a and the drain region of the driving transistor 202a share one diffusion region 406a. This can miniaturize the pixels 102 (pixel groups 1601), as compared with a case in which the diffusion region forming the source region of the reset transistor 1501a and the diffusion region forming the drain region of the driving transistor 202a are separately arranged in the X direction. Similarly, the reset transistor 1501b includes a p-type diffusion region 406b, a gate electrode 1701b, and a p-type diffusion region 1702b. The diffusion region 1702b is connected to the power supply potential Vss to function as the drain region of the reset transistor 1501b. The source region of the reset transistor 1501b and the drain region of the driving transistor 202b share one diffusion region 406b.

In this embodiment as well, the source region (diffusion region 404a), a gate electrode 405a, and the drain region (diffusion region 406a) of the driving transistor 202a of the pixel 102a and the source region (diffusion region 404b), a gate electrode 405b, and the drain region (diffusion region 406b) of the driving transistor 202b of the pixel 102b are sequentially arranged in the positive X direction. Thus, similar to the above-described first and second embodiments, in the light emitting device 101, a difference in electrical characteristic of the driving transistor 202 between the pixels 102 can be reduced, thereby suppressing degradation in display image quality. Furthermore, in this embodiment, the source region (diffusion region 406a), the gate electrode 1701a, and the drain region (diffusion region 1702a) of the reset transistor 1501a arranged in the pixel 102a and the source region (diffusion region 406b), the gate electrode 1701b, and the drain region (diffusion region 1702b) of the reset transistor 1501b arranged in the pixel 102b are sequentially arranged in the positive X direction. Thus, in the light emitting device 101, a difference in electrical characteristic of the reset transistor 1501 between the pixels 102 can be reduced, thereby suppressing degradation in display image quality. As shown in FIG. 17, in the pixel 102, the arrangement order of the source region, gate electrode, and drain region of the driving transistor 202 in the positive X direction may be the same as that of the source region, gate electrode, and drain region of the reset transistor 1501. For example, with respect to each of the reset transistors 1501a and 1501b, the source region, gate electrode, and drain region may be arranged in this order in the negative X direction.

In this embodiment, the reset transistor 1501a of the pixel 102a and the reset transistor 1501b of the pixel 102b are arranged so that currents flow in the same direction. However, the present invention is not limited to this, and currents need not flow in the same direction. For example, the reset transistor 1501a arranged in the pixel 102a and the reset transistor 1501b arranged in the pixel 102b may be designed so that currents flow in the opposite directions. This is implemented when the driving transistor 202 causes a current to flow in response to a luminance signal with a voltage corresponding to luminance information while the reset transistor 1501 resets the light emitting element 201. Thus, the control accuracy of the reset transistor 1501 may be lower than that of the driving transistor 202. Therefore, in accordance with the arrangement of the pixels 102 and the pixel groups 1601, the flow direction of a current in each reset transistor 1501 may be decided appropriately.

In this embodiment as well, if the distance between the gate electrode 405 of the driving transistor 202 and a diffusion region 403 forming the drain region of the write transistor is different between the pixels 102a and 102b, the shape of a wiring pattern 903 may be different between the pixels 102a and 102b, similar to the above-described second embodiment. In the arrangement shown in FIG. 17, a length 1703a is a length between the gate electrode 405a of the driving transistor 202a and the contact portion of a diffusion region 403a forming the drain region of the write transistor 203a in the pixel 102a. Similarly, a length 1703b is a length between the gate electrode 405b of the driving transistor 202b and the contact portion of a diffusion region 403b forming the drain region of the write transistor 203b in the pixel 102b. A length 1704a is the length of a portion where the wiring pattern 903a overlaps the gate electrode 405a of the driving transistor 202a. Similarly, a length 1704b is the length of a portion where the wiring pattern 903b overlaps the gate electrode 405b of the driving transistor 202b.

In the arrangement shown in FIG. 17, the length 1703a of the pixel 102a is shorter than the length 1703b of the pixel 102b. To the contrary, the length 1704a of the pixel 102a is longer than the length 1704b of the pixel 102b. This can increase the parasitic capacitance of the wiring pattern 903a to be almost equal to the parasitic capacitance of the wiring pattern 903b. As a result, the gate-source capacitance of the driving transistor 202a for holding a voltage corresponding to luminance information is almost equal to that of the driving transistor 202b, thereby reducing the difference in electrical characteristic between the pixels 102a and 102b. Thus, in this embodiment as well, it is possible to reduce a luminance unevenness between the pixels 102a and 102b, thereby suppressing degradation in display image quality.

In the arrangement shown in FIG. 17, the length 1703a is shorter than the length 1703b, and thus the length 1704a is shorter than the length 1704b. However, if the length 1703a is longer than the length 1703b, the length 1704a is made shorter than the length 1704b. As shown in FIG. 17, the wiring pattern 903 is arranged in the X direction on the gate electrode 405. However, the wiring pattern 903 may be arranged to bend from the X direction to the Y direction. Furthermore, as shown in FIG. 17, a wiring pattern 903a may extend from the gate electrode 405a on the side opposite to the pixel 102b. In addition, the positions of the write transistors 203a and 203b are adjusted so that the distance between the gate electrode 405 of the driving transistor 202 and the diffusion region 403 forming the drain region of the write transistor becomes the same between the pixels 102a and 102b. In this case, the wiring pattern 903a and a wiring pattern 903b may have equal lengths and areas. For example, the wiring patterns 903a and 903b may have line-symmetric shapes with respect to a line, in the Y direction, which passes through the center of the diffusion region 401 in the X direction.

Figure 18:
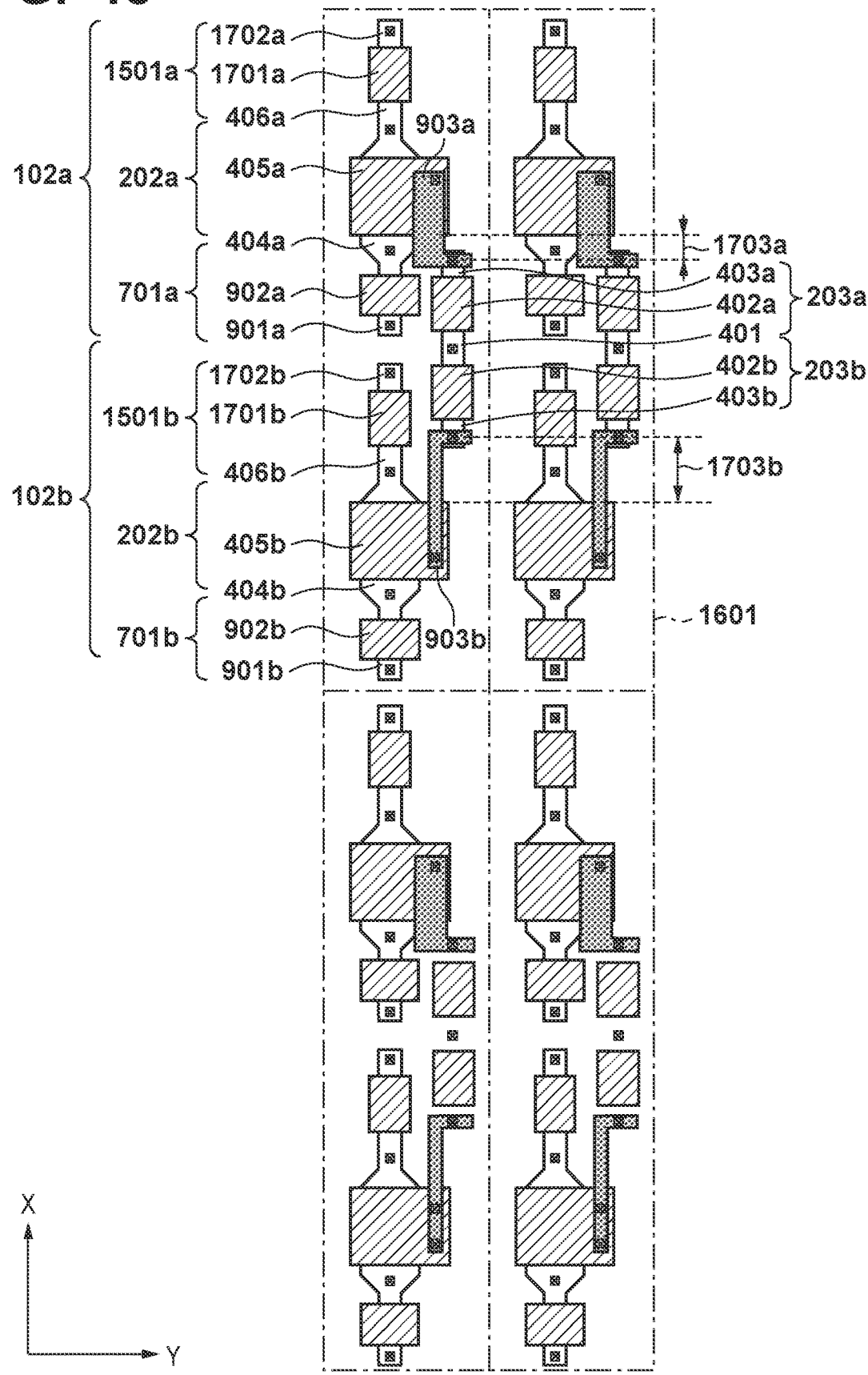
FIG. 18 is a plan view showing a modification of the pixels shown in FIG. 17.

FIG. 18 shows a modification of the wiring pattern 903 shown in FIG. 17. Similar to the above-described arrangement shown in FIG. 11, the parasitic capacitance of the wiring pattern 903 may be adjusted by the area where the wiring pattern 903 overlaps the gate electrode 405 of the driving transistor 202. In the arrangement shown in FIG. 18, the length 1703a is shorter than the length 1703b, and thus the area where the wiring pattern 903a and the gate electrode 405a overlap each other is larger than the area where the wiring pattern 903b and the gate electrode 405b overlap each other. This can increase the parasitic capacitance of the wiring pattern 903a to be almost equal to the parasitic capacitance of the wiring pattern 903b. At this time, as shown in FIG. 18, the parasitic capacitance of the wiring pattern 903 may be adjusted by differentiating the width of a portion, extending in the X direction, of the wiring pattern 903 between the pixels 102a and 102b.

Figure 19:
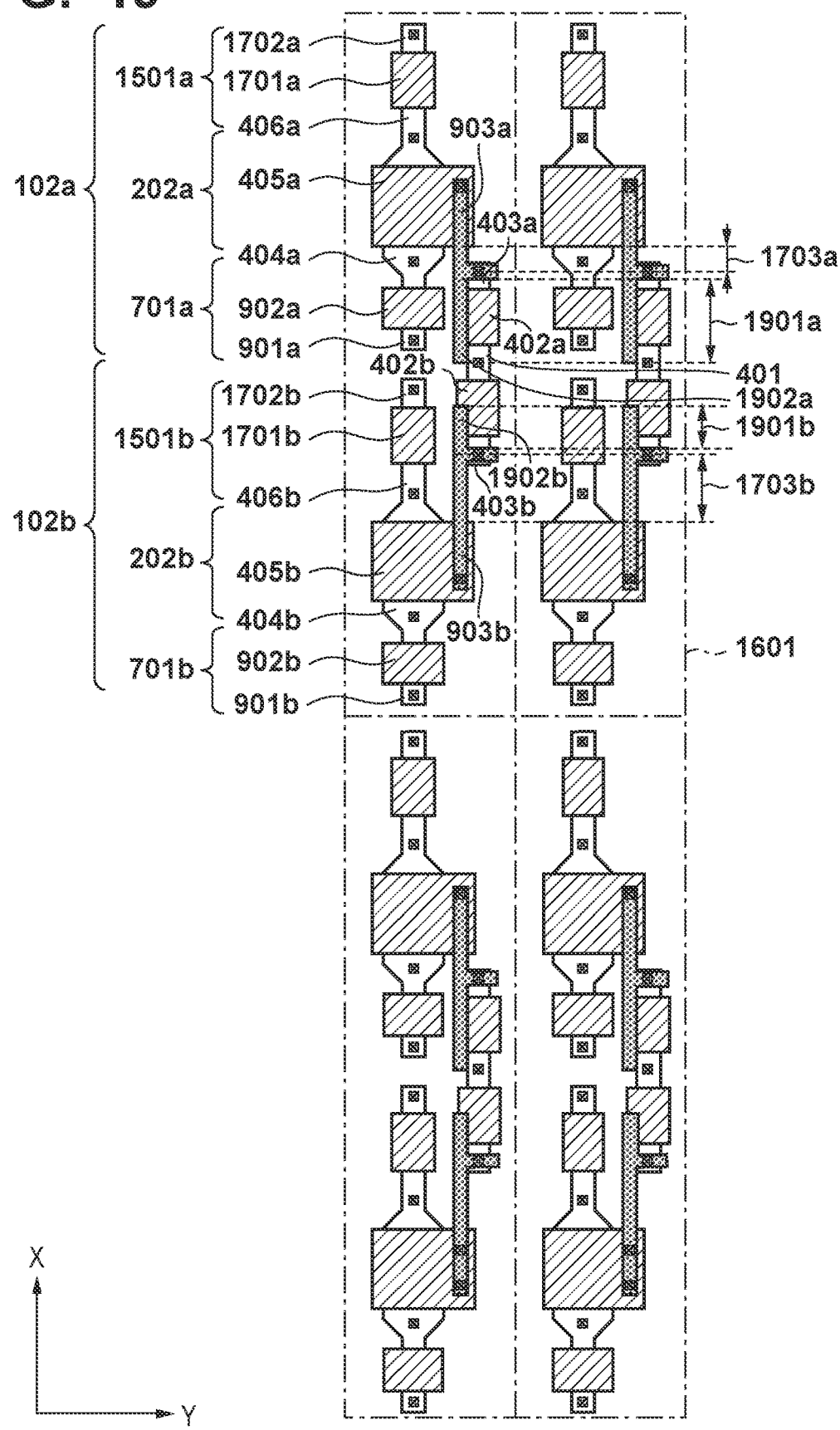
FIG. 19 is a plan view showing a modification of the pixels shown in FIG. 17.

FIG. 19 shows another modification of the wiring pattern 903 shown in FIG. 17 or 18. A length 1901a indicates the length of a portion 1902a arranged on the side of the pixel 102b with respect to a portion extending in the Y direction of a portion, extending in the X direction, of the wiring pattern 903a. Similarly, a length 1901b indicates the length of a portion 1902b arranged on the side of the pixel 102a with respect to a portion extending in the Y direction of a portion, extending in the X direction, of the wiring pattern 903b. At this time, similar to the above-described arrangement shown in FIG. 12, the parasitic capacitance of the wiring pattern 903 may be adjusted by adjusting the lengths 1901a and 1901b. In the arrangement shown in FIG. 19, the length 1703a is shorter than the length 1703b, and thus the length 1901a is longer than the length 1901b. This can increase the parasitic capacitance of the wiring pattern 903a to be almost equal to the parasitic capacitance of the wiring pattern 903b.

Figure 20:
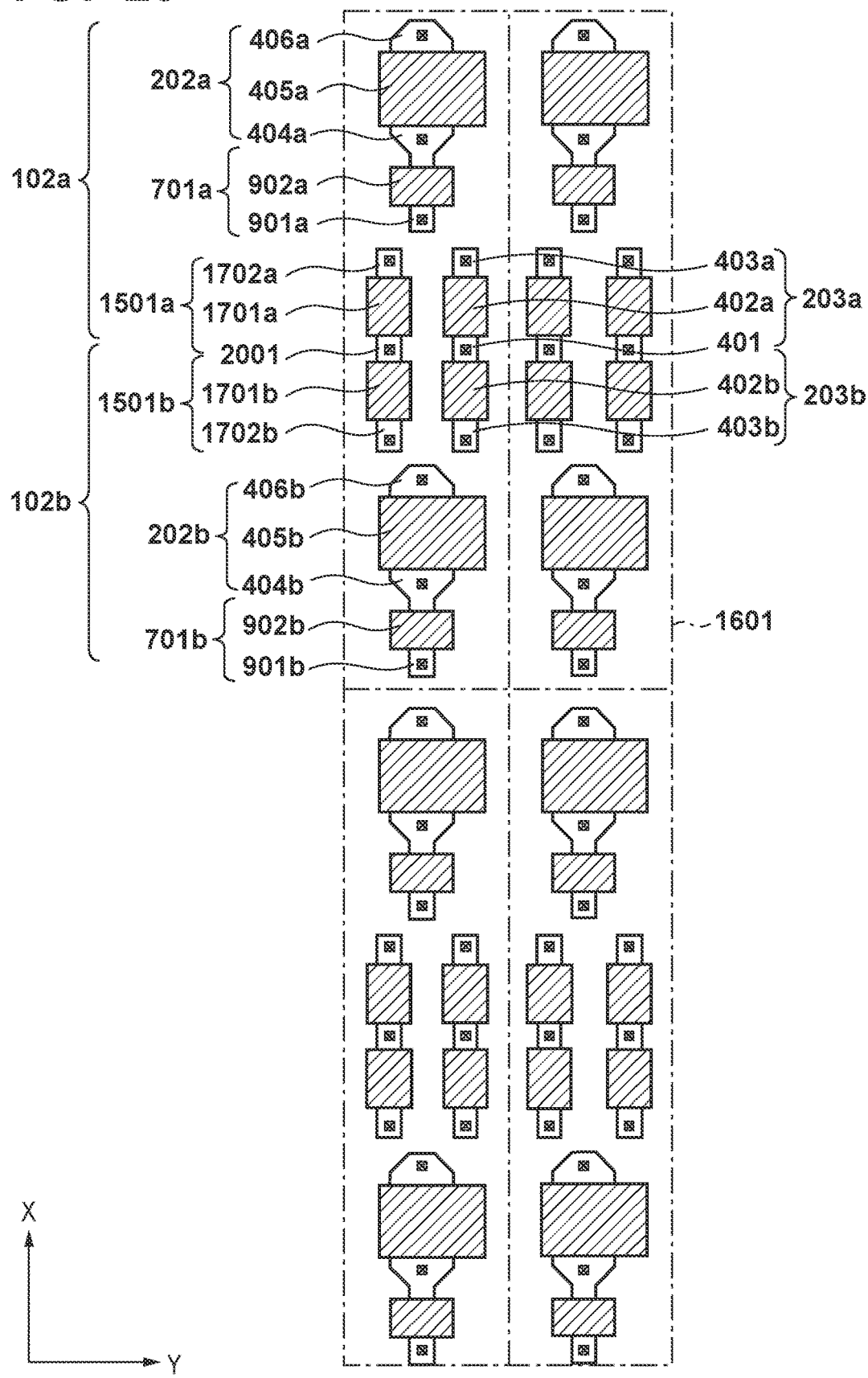
FIG. 20 is a plan view showing a modification of the pixels shown in FIG. 17.

FIG. 20 shows a modification of the arrangement of the transistors shown in FIG. 17. In each pixel group 1601, the write transistor 203a of the pixel 102a and the write transistor 203b of the pixel 102b are arranged between the driving transistor 202a of the pixel 102a and the driving transistor 202b of the pixel 102b. Furthermore, the reset transistor 1501a of the pixel 102a and the reset transistor 1501b of the pixel 102b are arranged between the driving transistor 202a of the pixel 102a and the driving transistor 202b of the pixel 102b in the X direction. The light emission control transistor 701a of the pixel 102a is arranged between the driving transistor 202a of the pixel 102a and the write transistor 203a of the pixel 102a. The light emission control transistor 701b of the pixel 102b is arranged on the side, opposite to the pixel 102a, of the driving transistor 202b of the pixel 102b. The drain region of the reset transistor 1501a of the pixel 102a and the drain region of the reset transistor arranged in the pixel 102b share one diffusion region 2001 connected to the power supply potential Vss. This can miniaturize the pixels 102 (pixel groups 1601), as compared with a case in which the diffusion region forming the drain region of the reset transistor 1501a and the diffusion region forming the drain region of the reset transistor 1501b are separately arranged in the X direction.

The write transistors 203a and 203b of the pixels 102a and 102b and the reset transistors 1501a and 1501b of the pixels 102a and 102b are arranged side by side in the Y direction. The write transistors 203a and 203b of the pixels 102a and 102b and the reset transistors 1501a and 1501b of the pixels 102a and 102b may be reversed, as compared with the arrangement shown in FIG. 20.

Figure 21:
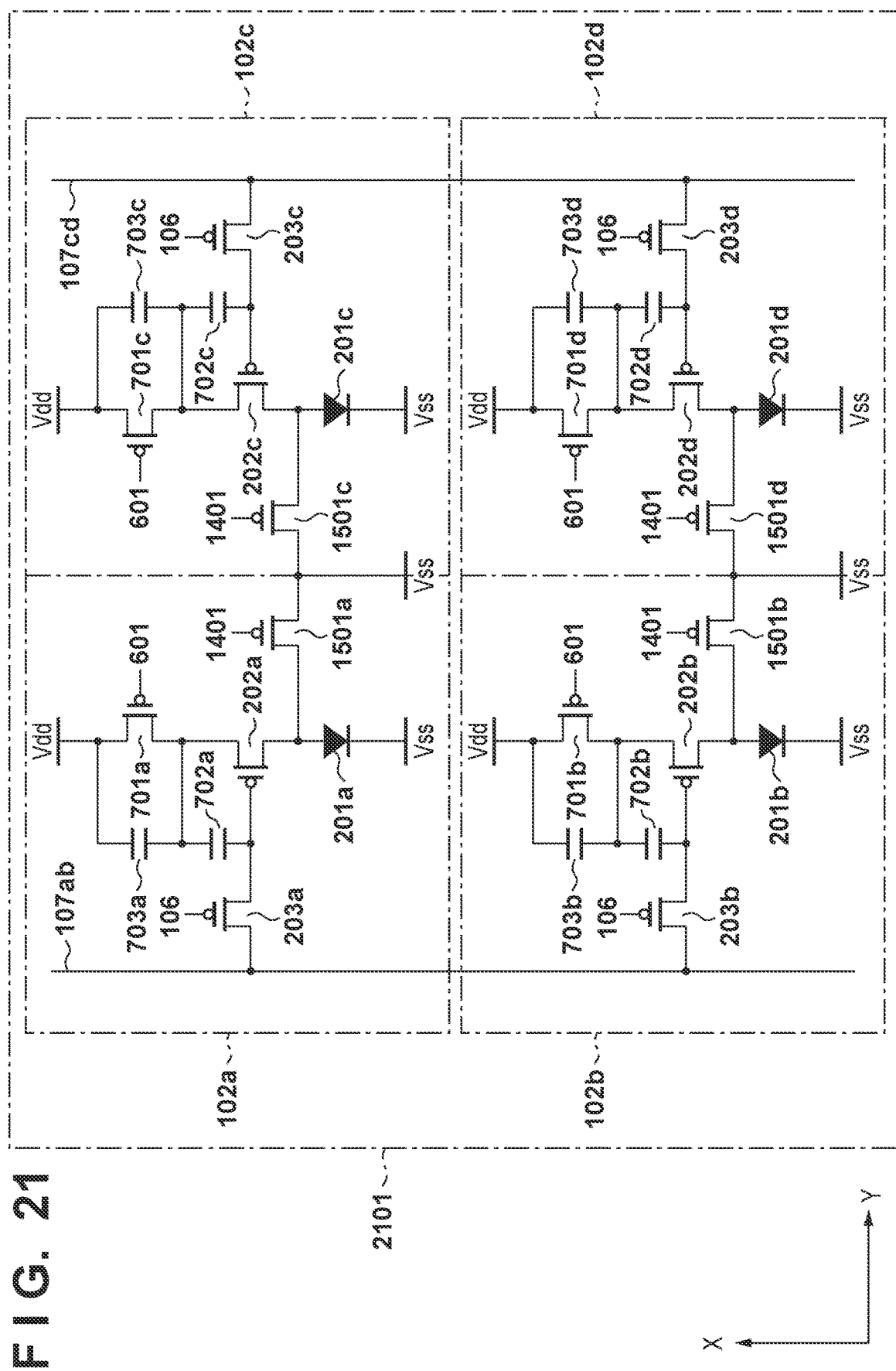
FIG. 21 is a circuit diagram showing an example of the arrangement of four pixels of the light emitting device shown in FIG. 14.

FIG. 21 is a circuit diagram showing the connection relationship among four adjacent pixels 102. The plurality of pixels 102 further include a pixel 102c arranged adjacent to the pixel 102a in the Y direction and a pixel 102d arranged adjacent to the pixel 102c in the X direction and adjacent to the pixel 102b in the Y direction. Similar to each of the above-described embodiments, the source region of the write transistor 203a of the pixel 102a and the source region of the write transistor 203b of the pixel 102b are connected via a signal line 107ab. The source region of a write transistor 203c of the pixel 102c and the source region of a write transistor 203d of the pixel 102d are connected via a signal line 107*cd*. Furthermore, in the pixels 102*a* and 102*c* adjacent to each other in the Y direction, the drain region of the reset transistor 1501*a* of the pixel 102*a* and the drain region of a reset transistor 1501*c* of the pixel 102*c* are connected to the same node connected to the power supply potential Vss. Similarly, in the pixels 102*b* and 102*d* adjacent to each other in the Y direction, the drain region of the reset transistor 1501*b* of the pixel 102*b* and the drain region of a reset transistor 1501*d* of the pixel 102*d* are connected to the same node connected to the power supply potential Vss. The pixels 102*a*, 102*b*, 102*c*, and 102*d* form a pixel group 2101.

Figure 22:
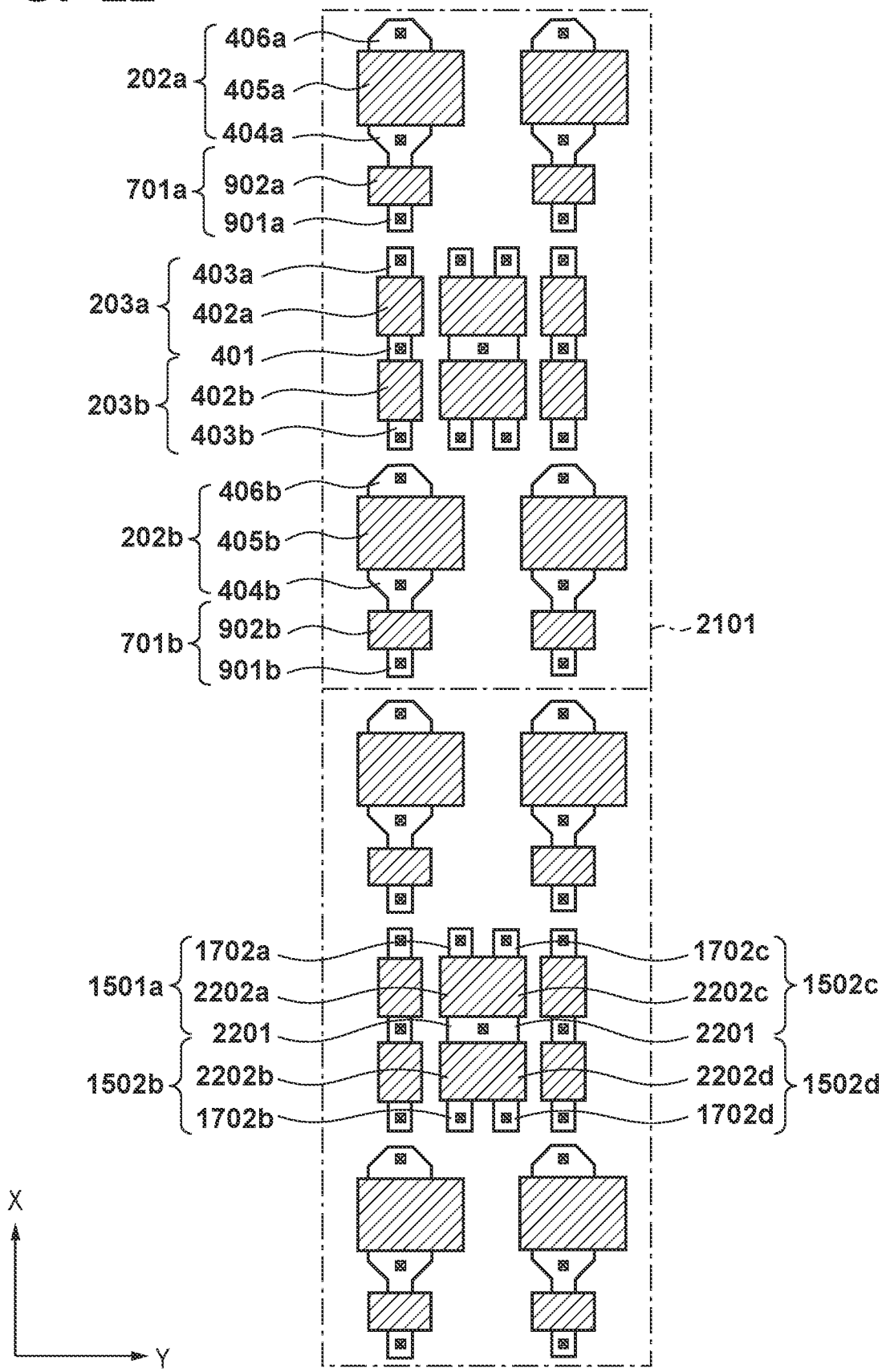
FIG. 22 is a plan view showing an example of the arrangement of the pixels shown in FIG. 21.

FIG. 22 shows an example of the arrangement of the transistors of the circuit shown in FIG. 21. As shown in FIG. 22, the reset transistor 1501*a* of the pixel 102*a* includes a p-type diffusion region 2201, a gate electrode 2202*a*, and the p-type diffusion region 1702*a*. The reset transistor 1501*b* of the pixel 102*b* includes the diffusion region 2201, a gate electrode 2202*b*, and the p-type diffusion region 1702*b*. The reset transistor 1501*c* of the pixel 102*c* includes the diffusion region 2201, a gate electrode 2202*c*, and a p-type diffusion region 1702*c*. The reset transistor 1501*d* of the pixel 102*d* includes the diffusion region 2201, a gate electrode 2202*d*, and a type diffusion region 1702*d*. That is, the drain regions of the reset transistors 1501*a*, 1501*b*, 1501*c*, and 1501*d* of the pixels 102*a*, 102*b*, 102*c*, and 102*d* share one diffusion region 2201. This can miniaturize the pixels 102 (pixel groups 2101).

The light emitting element 201 will now be described. The light emitting element 201 is provided by forming an anode, an organic compound layer, and a cathode on a substrate. A protection layer, a color filter, or the like may be provided on the cathode. If a color filter is provided, a planarizing layer may be provided between the protection layer and the color filter. The planarizing layer can be made of acrylic resin or the like.

In each of the above-described embodiments, a semiconductor substrate of silicon or the like is used as a substrate. However, the present invention is not limited to this, and quartz, glass, a silicon wafer, a resin, a metal, or the like may be used as a substrate. As in each of the above-described embodiments, a switching element such as a transistor and a wiring may be provided on the substrate, and an insulating layer may be provided thereon. The insulating layer may be made of any material as long as a contact hole for ensuring conductivity between the anode of the light emitting element 201 and the transistor formed on the substrate can be formed and insulation from the unconnected wiring pattern can be ensured. For example, a resin such as polyimide, silicon oxide, silicon nitride, or the like can be used.

A pair of electrodes (the above-described electrodes 501 and 503) can be used as electrodes. The pair of electrodes may be an anode and a cathode. When an electric field is applied in the direction in which the light emitting element 201 emits light, the electrode having a high potential is the anode, and the other is the cathode. It can also be said that the electrode that supplies holes to the light emitting layer of the light emitting element 201 is the anode and the electrode that supplies electrons is the cathode.

As the constituent material of the anode, a material having a large work function can be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used as the anode. Furthermore, a conductive polymer such as polyaniline, polypyrrole, or polythiophene can also be used as the anode.

One of these electrode materials may be used singly, or two or more of them may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. When the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function can be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used as the cathode. A metal oxide such as indium tin oxide (ITO) can also be used. One of these electrode materials may be used singly, or two or more of them may be used in combination. The cathode may have a single-layer structure or a multilayer structure. For the cathode, silver may be used, or a silver alloy may be used to suppress aggregation of silver. The ratio of the alloy is not limited as long as aggregation of silver can be suppressed. For example, the ratio between silver and a material other than silver may be 1:1.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but if direct current sputtering or alternating current sputtering is used, the good film coverage is provided and the resistance is easily lowered.

A protection layer may be provided on the cathode. For example, by adhering glass provided with a moisture absorbing agent on the cathode, permeation of water or the like into the light emitting layer such as an organic EL layer can be suppressed and occurrence of display defects can be suppressed. Furthermore, as another embodiment, a passivation film made of silicon nitride or the like may be provided on the cathode to suppress permeation of water or the like into the light emitting layer. For example, after forming the cathode and transferring it to another chamber without breaking the vacuum, a silicon nitride film having a thickness of 2 µm may be formed by a chemical vapor deposition method (CVD method), thereby obtaining the protection layer. The protection layer may be provided using an atomic deposition method (ALD method) after forming a film using the CVD method.

A color filter may be provided on the protection layer. For example, a color filter considering the size of the light emitting element 201 may be provided on another substrate, and the substrate with the color filter provided thereon may be bonded to the substrate with the light emitting element 201 provided thereon. Alternatively, a color filter may be patterned on the above-described protection layer using a photolithography technique. The color filter may be formed from a polymeric material.

A planarizing layer may be provided between the color filter and the protection layer. The planarizing layer may be formed from an organic compound, and may be made of a low-molecular material or a polymeric material. For example, the planarizing layer can be formed from a polymeric organic compound.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

A counter substrate may be provided on the planarizing layer. The counter substrate is called a counter substrate because it is provided at a position corresponding to the above-described substrate. The constituent material of the counter substrate may be the same as that of the above-described substrate.

The organic layer 502 (hole injection layer, hole transport layer, electron blocking layer, light emitting layer, hole blocking layer, electron transport layer, electron injection layer, and the like) forming the light emitting element 201 according to an embodiment of the present invention is formed by the method to be described below. The organic layer 502 can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the organic layer 502 is formed by a vacuum deposition method, a solution coating method, or the like, crystallization or the like hardly occurs and excellent temporal stability is obtained. Furthermore, when the organic layer 502 is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Figure 23:
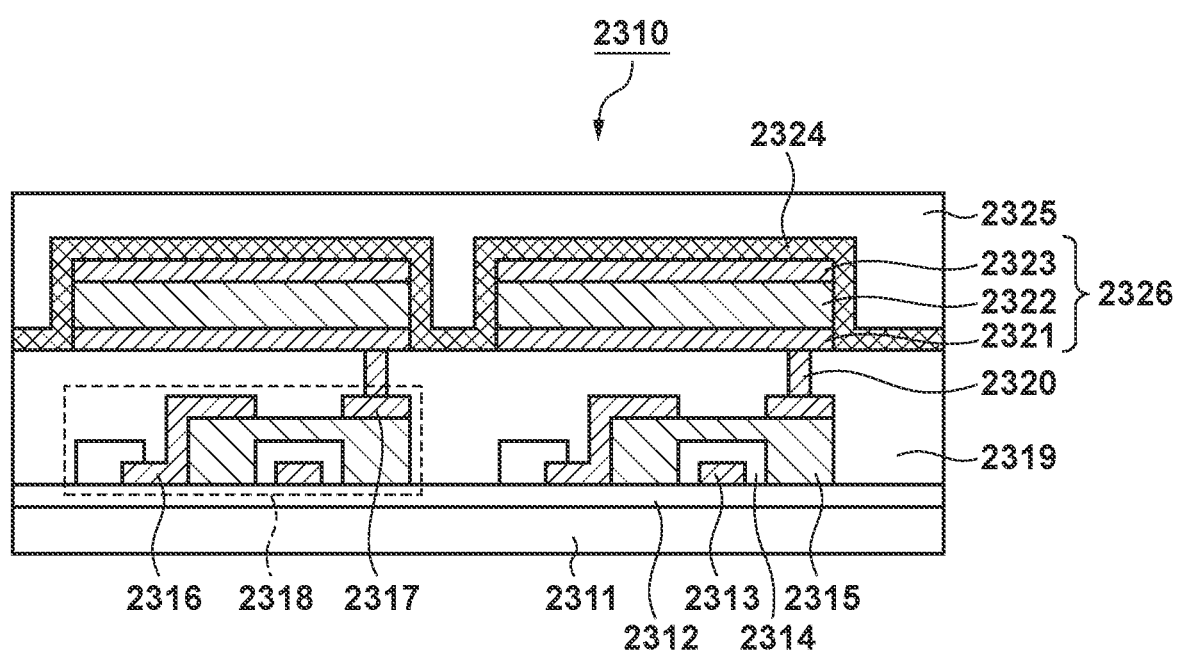
FIG. 23 is a sectional view showing an example of the arrangement of the light emitting device according to the embodiment.

Next, a light emitting device according to this embodiment will be described with reference to the accompanying drawings. FIG. 23 is a schematic sectional view showing an example, different from those shown in FIGS. 5 and 10 described above, of the light emitting device including a light emitting element as an example of the above-described light emitting element 201 and a TFT element connected to the light emitting element. The TFT element is an example of an active element.

A light emitting device 2310 shown in FIG. 23 is provided with a substrate 2311 of glass, silicon, or the like and an insulating layer 2312 thereon. An active element such as a TFT 2318 is arranged on the insulating layer 2312 and a gate electrode 2313, a gate insulating film 2314, and a semiconductor layer 2315 of the TFT 2318 are arranged. The TFT 2318 shown in FIG. 23 is an example of the above-described driving transistor 202. The TFT 2318 further includes the semiconductor layer 2315, a drain electrode 2316, and a source electrode 2317. An insulating film 2319 is provided on the TFT 2318. The source electrode 2317 and an anode 2321 forming the light emitting element are connected via a contact hole 2320 formed in the insulating film 2319.

Note that a method of electrically connecting the electrodes (anode and cathode) included in the light emitting element and the electrodes (source electrode and drain electrode) included in the TFT is not limited to the that shown in FIG. 23. That is, one of the anode and cathode and one of the source electrode and drain electrode of the TFT 2318 are electrically connected. The TFT indicates a thin-film transistor.

In the light emitting device 2310 shown in FIG. 23, an organic layer 2322 is illustrated as one layer. However, the organic layer 2322 may include a plurality of layers. Protection layers 2324 and 2325 are provided on a cathode 2323 to suppress the degradation of the light emitting element.

A transistor is used as a switching element in the light emitting device 2310 shown in FIG. 23 but may be used as another switching element.

The transistor used in the light emitting device 2310 shown in FIG. 23 is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that the thin-film transistor is also called a TFT element.

The transistor included in the light emitting device 2310 shown in FIG. 23 may be formed in a substrate such as an Si substrate. Here, being formed in a substrate means that a transistor is formed by processing the substrate itself such as an Si substrate. In other words, including a transistor in a substrate can be regarded as integrally forming the substrate and the transistor.

The light emission luminance of the light emitting element according to this embodiment is controlled by the TFT which is an example of a switching element, and the light emitting elements are provided in a plurality of planes to display an image with the light emission luminances of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light emitting element may be provided on the Si substrate.

Application examples in which the light emitting device 101 of each of the above-described embodiments is applied to a display device, a photoelectric conversion device, an electronic device, an illumination device, and a mobile device will be explained below with reference to FIGS. 24 to 29. In addition, the light emitting device 101 is applicable to the exposure light source of an electrophotographic image forming device, the backlight of a liquid crystal display device, a light emitting device including a color filter in a white light source, and the like. The display device may be an image information processing device that includes an image input unit for inputting image information from an area CCD, a linear CCD, a memory card, or the like, and an information processing unit for processing the input information, and displays the input image on a display unit. In addition, a display unit included in a camera or an inkjet printer may have a touch panel function. The driving type of the touch panel function may be an infrared type, a capacitance type, a resistive film type, or an electromagnetic induction type, and is not particularly limited. The display device may be used for the display unit of a multifunction printer.

Figure 24:
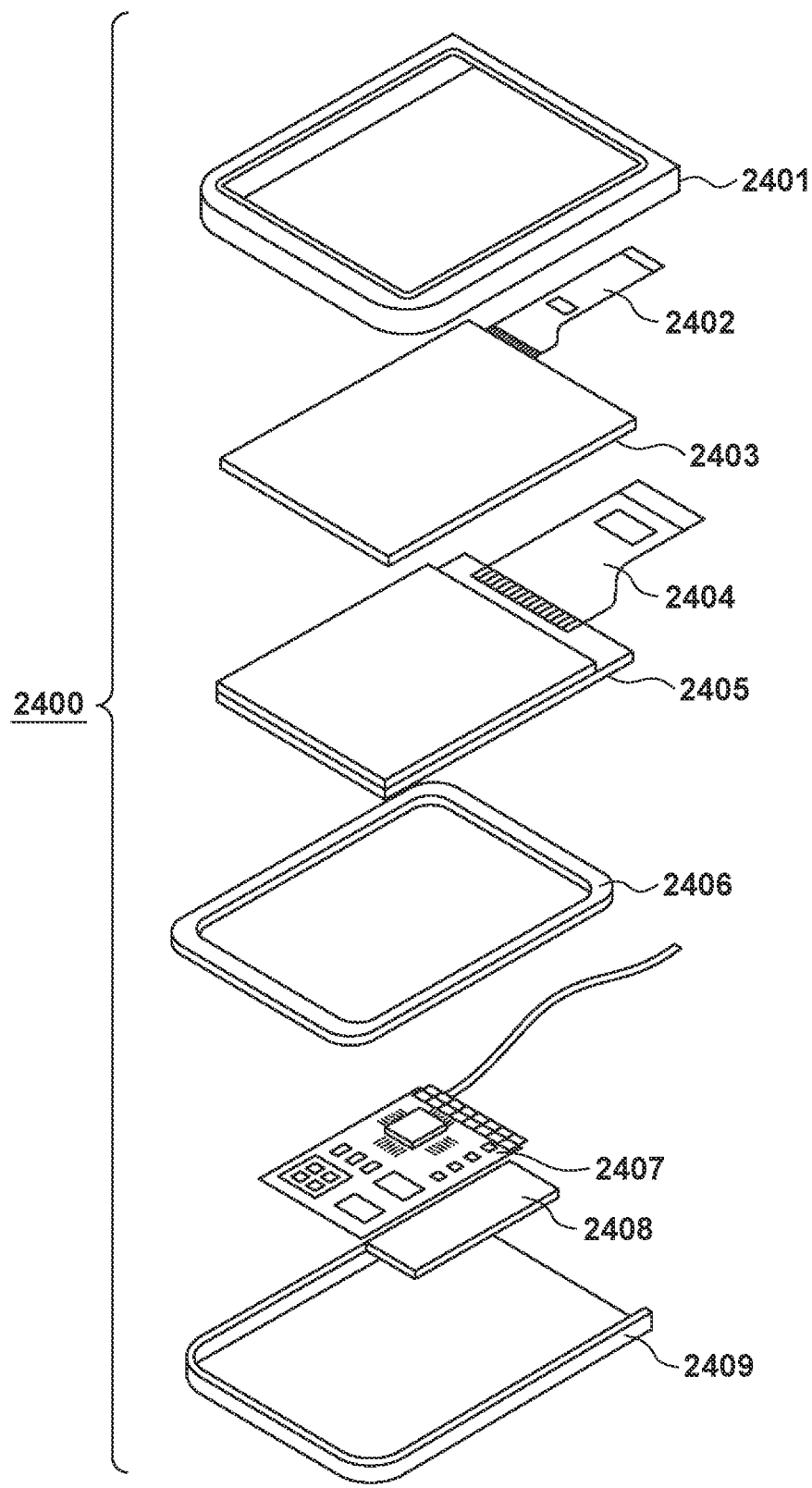
FIG. 24 is a view showing an example of a display device using the light emitting device according to the embodiment.

FIG. 24 is a schematic view showing an example of the display device using the light emitting device 101 according to this embodiment. A display device 2400 can include a touch panel 2403, a display panel 2405, a frame 2406, a circuit board 2407, and a battery 2408 between an upper cover 2401 and a lower cover 2409. Flexible printed circuits (FPCs) 2402 and 2404 are respectively connected to the touch panel 2403 and the display panel 2405. Active elements such as transistors are arranged on the circuit board 2407. The battery 2408 is unnecessary if the display device 2400 is not a portable device. Even when the display device 2400 is a portable device, the battery 2408 need not be provided in this position. The above-described light emitting device 101 in which the light emitting layer of the organic layer 502 contains an organic light emitting material such as an organic EL is applicable to the display panel 2405. The light emitting device 101 that functions as the display panel 2405 operates by being connected to the active elements such as transistors arranged on the circuit board 2407.

The display device 2400 shown in FIG. 24 may also be used as a display unit of a photoelectric conversion device (imaging device) including an optical unit having a plurality of lenses, and an imaging element for receiving light having passed through the optical unit and photoelectrically converting the light into an electrical signal. The photoelectric conversion device can have a display unit for displaying information acquired by the imaging element. In addition, the display unit can be either a display unit exposed outside the photoelectric conversion device, or a display unit arranged in the finder. The photoelectric conversion device may also be a digital camera or a digital video camera.

Figure 25:
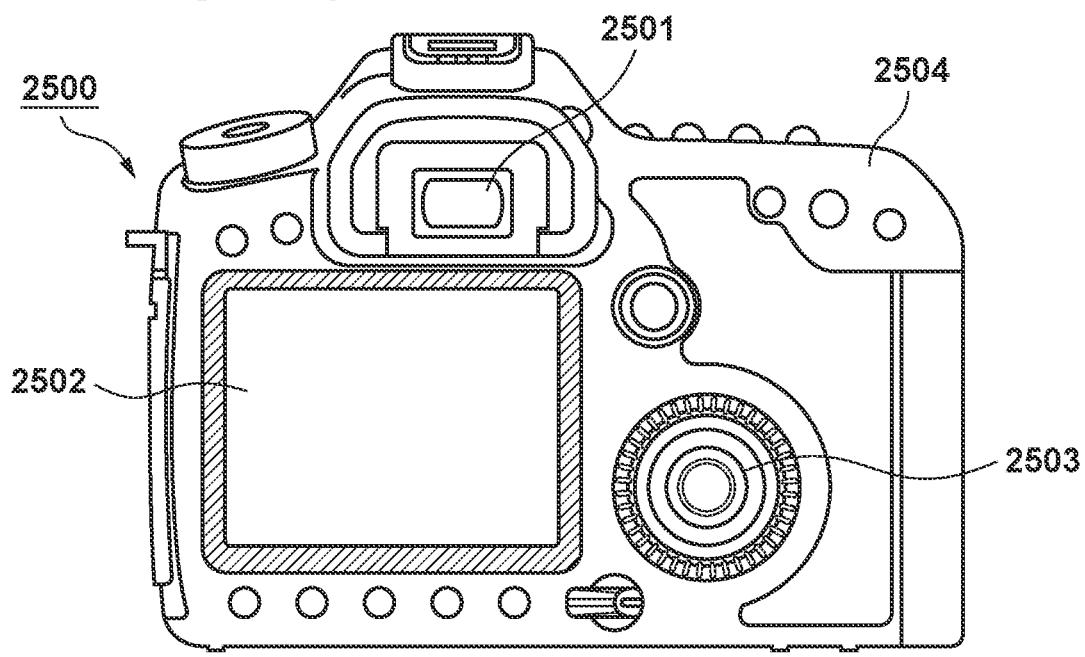
FIG. 25 is a view showing an example of a photoelectric conversion device using the light emitting device according to the embodiment.

FIG. 25 is a schematic view showing an example of the photoelectric conversion device using the light emitting device 101 according to this embodiment. A photoelectric conversion device 2500 can include a viewfinder 2501, a rear display 2502, an operation unit 2503, and a housing 2504. The photoelectric conversion device 2500 can also be referred to as an imaging device. The above-described light emitting device 101 in which the light emitting layer of the organic layer 502 contains the organic light emitting material is applicable to the viewfinder 2501 as a display unit. In this case, the light emitting device 101 can display not only an image to be captured but also environment information, imaging instructions, and the like. Examples of the environment information are the intensity and direction of external light, the moving velocity of an object, and the possibility that an object is covered with an obstacle.

The timing suitable for imaging is often a very short time, so the information is preferably displayed as soon as possible. Accordingly, the above-described light emitting device 101 in which the light emitting layer of the organic layer 502 contains the organic light emitting material can be used as the viewfinder 2501. This is so because the organic light emitting material has a high response speed. For the light emitting device 101 using the organic light emitting material, a display speed is obtained. The light emitting device 101 is more suitable for these devices than a liquid crystal display device.

The photoelectric conversion device 2500 includes an optical unit (not shown). This optical unit has a plurality of lenses, and forms an image of light having passed through the optical unit on a photoelectric conversion element (not shown) that is accommodated in the housing 2504 and receives the light. The focal points of the plurality of lenses can be adjusted by adjusting the relative positions. This operation can also automatically be performed.

The above-described light emitting device 101 in which the light emitting layer of the organic layer 502 contains the organic light emitting material may be applied to the display unit of the electronic device. At this time, the light emitting device 101 can have both a display function and an operation function. Examples of the portable terminal are a portable phone such as a smartphone, a tablet, and a head mounted display.

Figure 26:
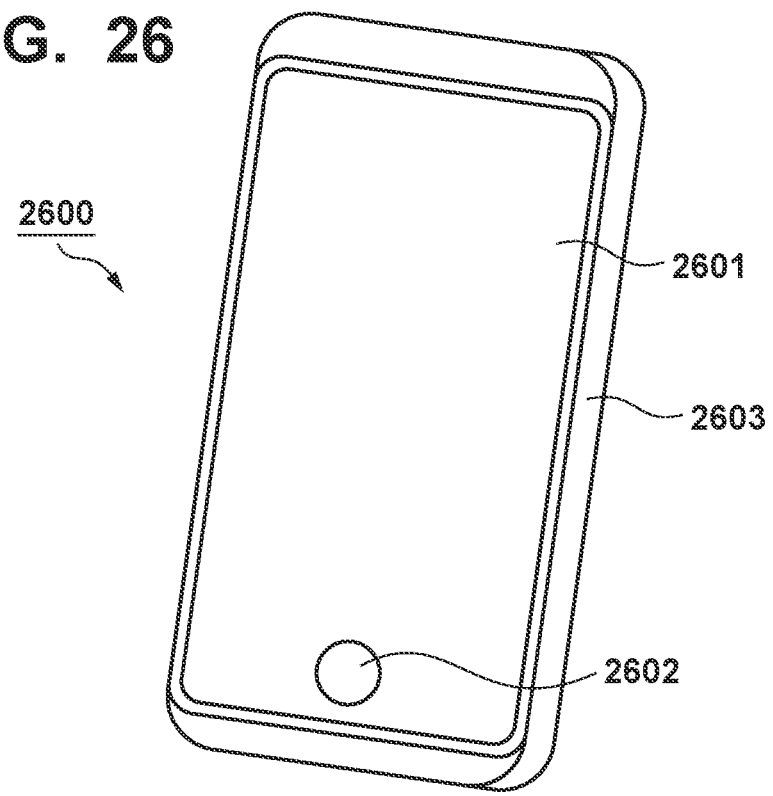
FIG. 26 is a view showing an example of an electronic device using the light emitting device according to the embodiment.

FIG. 26 is a schematic view showing an example of the electronic device using the light emitting device 101 according to this embodiment. An electronic device 2600 includes a display unit 2601, an operation unit 2602, and a housing 2603. The housing 2603 can accommodate a circuit, a printed board having this circuit, a battery, and a communication unit. The operation unit 2602 can be either a button or a touch-panel-type reaction unit. The operation unit 2602 can also be a biometric authentication unit that performs unlocking or the like by authenticating the fingerprint. A portable device including a communication unit can also be regarded as a communication device. The above-described light emitting device 101 in which the light emitting layer of the organic layer 502 contains the organic light emitting material is applicable to the display unit 2601.

Figure 27A:
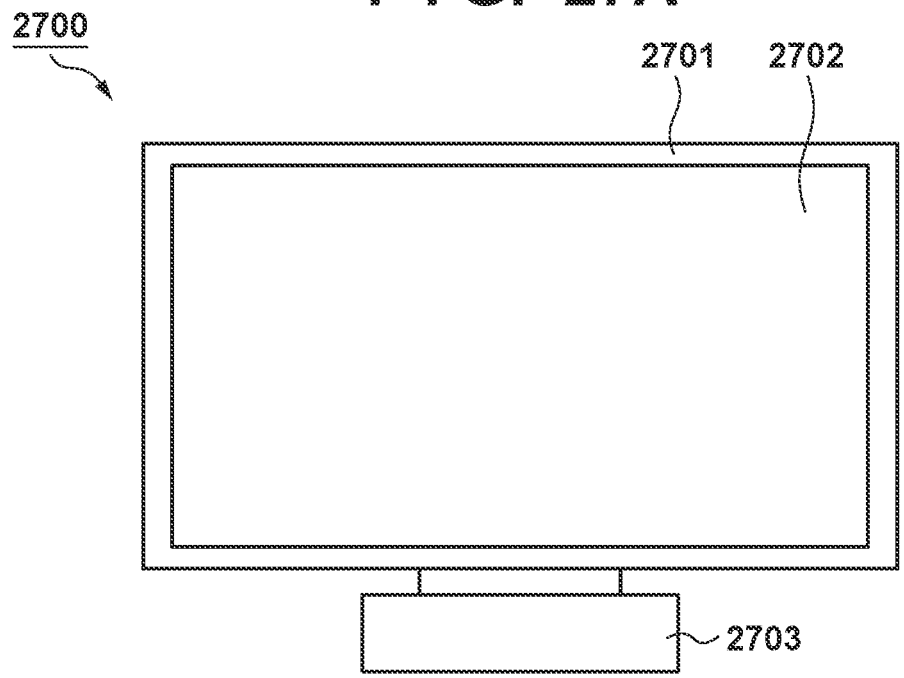
FIGS. 27A and 27B are views showing examples of a display device using the light emitting device according to the embodiment.
Figure 27B:
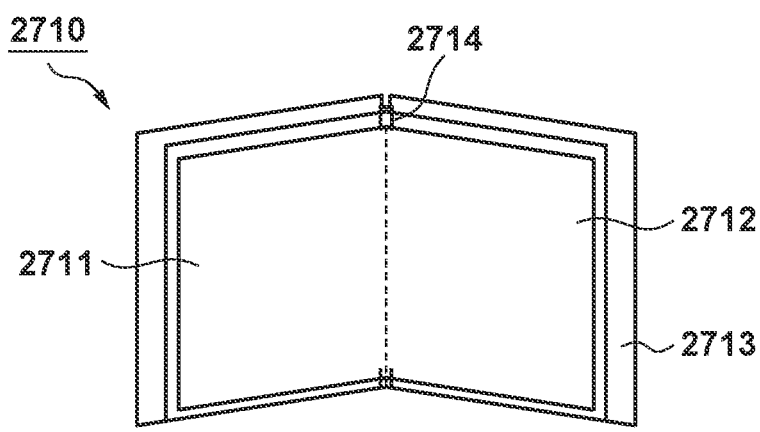

FIGS. 27A and 27B are schematic views showing examples of the display device using the light emitting device 101 according to this embodiment. FIG. 27A shows a display device such as a television monitor or a PC monitor. A display device 2700 includes a frame 2701 and a display unit 2702. The above-described light emitting device 101 in which the light emitting layer of the organic layer 502 contains the organic light emitting material is applicable to the display unit 2702. The display device 2700 may also include a base 2703 that supports the frame 2701 and the display unit 2702. The base 2703 is not limited to the form shown in FIG. 27A. For example, the lower side of the frame 2701 may also function as the base 2703. In addition, the frame 2701 and the display unit 2702 can be bent. The radius of curvature in this case can be 5,000 (inclusive) to 6,000 (inclusive) mm.

FIG. 27B is a schematic view showing another example of the display device using the light emitting device 101 according to this embodiment. A display device 2710 shown in FIG. 27B can be folded, that is, the display device 2710 is a so-called foldable display device. The display device 2710 includes a first display unit 2711, a second display unit 2712, a housing 2713, and a bending point 2714. The above-described light emitting device 101 in which the light emitting layer of the organic layer 502 contains the organic light emitting material is applicable to each of the first display unit 2711 and the second display unit 2712. The first display unit 2711 and the second display unit 2712 can also be one seamless display device. The first display unit 2711 and the second display unit 2712 can be divided by the bending point. The first display unit 2711 and the second display unit 2712 can display different images, and can also display one image together.

Figure 28:
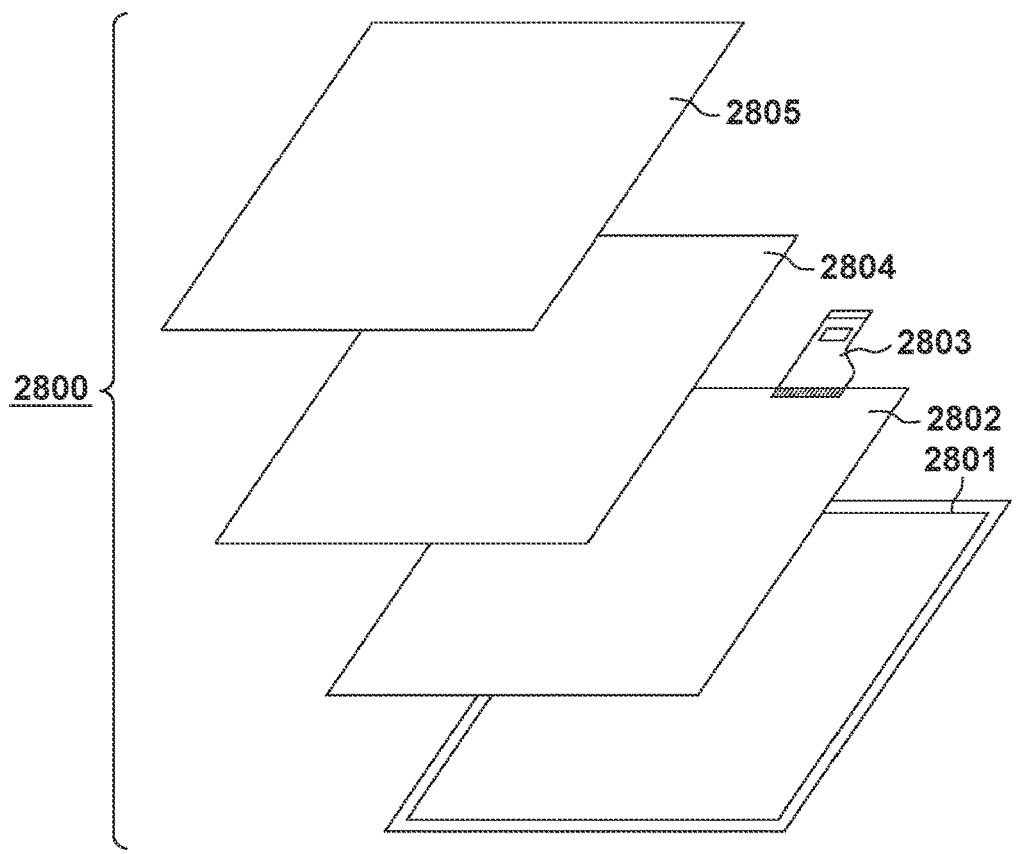
FIG. 28 is a view showing an example of an illumination device using the light emitting device according to the embodiment.

FIG. 28 is a schematic view showing an example of the illumination device using the light emitting device 101 according to this embodiment. An illumination device 2800 can include a housing 2801, a light source 2802, a circuit board 2803, an optical film 2804, and a light-diffusing unit 2805. The above-described light emitting device 101 in which the light emitting layer of the organic layer 502 contains the organic light emitting material is applicable to the light source 2802. The optical film 2804 can be a filter that improves the color rendering of the light source. When performing lighting-up or the like, the light-diffusing unit 2805 can throw the light of the light source over a broad range by effectively diffusing the light. The illumination device 2800 can also include a cover on the outermost portion, as needed. The illumination device 2800 can include both the optical film 2804 and the light-diffusing unit 2805, and can also include only one of them.

The illumination device 2800 is a device for illuminating the room or the like. The illumination device 2800 can emit white light, natural white light, or light of any color from blue to red. The illumination device 2800 can also include a light control circuit for controlling these light components. The illumination device 2800 can also include a power supply circuit to be connected to the light emitting device 101 that functions as the light source 2802. This power supply circuit can be a circuit for converting an AC voltage into a DC voltage. "White" has a color temperature of 4,200 K, and "natural white" has a color temperature of 5,000 K. The illumination device 2800 may also have a color filter. In addition, the illumination device 2800 can have a heat radiation unit. The heat radiation unit radiates the internal heat of the device to the outside of the device, and examples are a metal having a high specific heat and liquid silicon.

Figure 29:
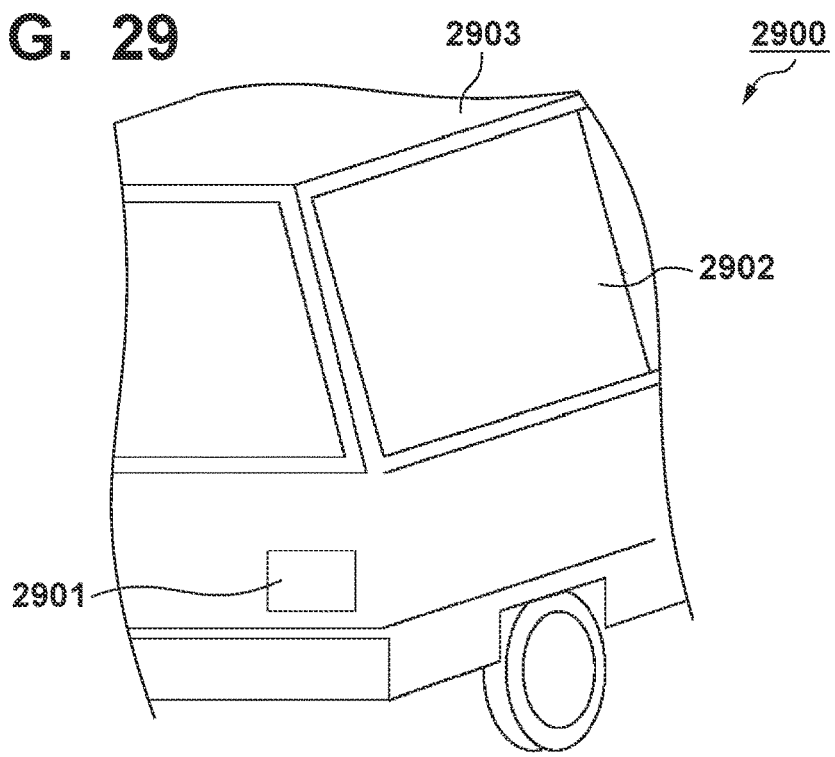
FIG. 29 is a view showing an example of a mobile device using the light emitting device according to the embodiment.

FIG. 29 is a schematic view of an automobile including a taillight as an example of a vehicle lighting appliance using the light emitting device 101 according to this embodiment. An automobile 2900 has a taillight 2901, and the taillight 2901 may be turned on when performing a braking operation or the like. The light emitting device 101 according to this embodiment may be used as a headlight serving as a vehicle lighting appliance. The automobile is an example of a mobile device, and the mobile device may be a ship, a drone, an airplane, a railway vehicle, or the like. The mobile device can include a main body and a lighting appliance installed in the main body. The lighting appliance may also be a device that sends a notification of the current position of the main body.

The above-described light emitting device 101 in which the light emitting layer of the organic layer 502 contains the organic light emitting material is applicable to the taillight 2901. The taillight 2901 can have a protection member for protecting the light emitting device 101 that functions as the taillight 2901. The material of the protection member is not limited as long as the material is a transparent material with a strength that is high to some extent, and can be polycarbonate. The protection member can also be formed by mixing a furandicarboxylic acid derivative or an acrylonitrile derivative in polycarbonate.

The automobile 2900 can include a body 2903, and a window 2902 attached to the body 2903. This window can be a window for checking the front and back of the automobile, and can also be a transparent display. The above-described light emitting device 101 in which the light emitting layer of the organic layer 502 contains the organic light emitting material can be used as this transparent display. In this case, the constituent materials such as the electrodes of the light emitting device 101 are formed by transparent members.

Some embodiments of the present invention can provide a technique advantageous in miniaturizing pixels and suppressing degradation in image quality in a light emitting device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-188006, filed Oct. 11, 2019 which is hereby incorporated by reference herein in its entirety.

What is claimed is:

1. A light emitting device comprising a plurality of pixels arranged on a substrate in an array in a first direction and a second direction intersecting the first direction,
    wherein each of the plurality of pixels includes a light emitting element, a first transistor having a drain region connected to an anode of the light emitting element, and a second transistor having a drain region connected to a gate electrode of the first transistor,
    wherein the plurality of pixels include a first pixel and a second pixel, which are adjacent to each other in the first direction,
    wherein a source region of the second transistor of the first pixel and a source region of the second transistor of the second pixel share one diffusion region,
    wherein a source region, a gate electrode, and the drain region of the first transistor of the first pixel and a source region, a gate electrode, and the drain region of the first transistor of the second pixel are sequentially arranged in one of a positive direction and a negative direction in the first direction, and
    wherein a length between the gate electrode of the first transistor and the drain region of the second transistor of one of the first pixel and the second pixel is longer than a length between the gate electrode of the first transistor and the drain region of the second transistor of the other of the first pixel and the second pixel.

2. The device according to claim 1, wherein each of the plurality of pixels further includes a wiring pattern configured to connect the gate electrode of the first transistor and the drain region of the second transistor.

3. The device according to claim 2, wherein a length of a portion where the wiring pattern overlaps the gate electrode of the first transistor in the one pixel is shorter than a length of a portion where the wiring pattern overlaps the gate electrode of the first transistor in the other pixel.

4. The device according to claim 2, wherein an area where the wiring pattern overlaps the gate electrode of the first transistor in the one pixel is smaller than an area where the wiring pattern overlaps the gate electrode of the first transistor in the other pixel.

5. The device according to claim 2, wherein a width of a portion, extending in the first direction, of the wiring pattern of the one pixel is smaller than a width of a portion, extending in the first direction, of the wiring pattern of the other pixel.

6. The device according to claim 2, wherein the wiring pattern includes a portion extending in the first direction and a portion extending in the second direction,
    wherein the portion, extending in the first direction, of the wiring pattern of the one pixel includes a first portion arranged on a side of the second pixel with respect to the portion extending in the second direction, wherein the portion, extending in the first direction, of the wiring pattern of the other pixel includes a second portion arranged on a side of the first pixel with respect to the portion extending in the second direction, and wherein a length of the first portion is shorter than a length of the second portion.

7. The device according to claim 1, wherein the second transistor of the first pixel and the second transistor of the second pixel are arranged between the first transistor of the first pixel and the first transistor of the second pixel.

8. The device according to claim 7, wherein each of the plurality of pixels further includes a third transistor having a drain region connected to the source region of the first transistor and configured to control light emission or non-light emission of the light emitting element, and wherein, in the first direction, the third transistor of the first pixel is arranged between the first transistor and the second transistor of the first pixel, and the third transistor of the second pixel is arranged on a side, opposite to the first pixel, of the first transistor of the second pixel.

9. The device according to claim 1, wherein each of the plurality of pixels further includes a third transistor having a drain region connected to the source region of the first transistor and configured to control light emission or non-light emission of the light emitting element.

10. The device according to claim 9, wherein a source region, a gate electrode, and the drain region of the third transistor of the first pixel and a source region, a gate electrode, and the drain region of the third transistor of the second pixel are sequentially arranged in one of a positive direction and a negative direction in the first direction.

11. The device according to claim 1, wherein each of the plurality of pixels further includes a fourth transistor configured to reset the light emitting element.

12. The device according to claim 11, wherein with respect to each of the fourth transistor of the first pixel and the fourth transistor of the second pixel, a drain region, a gate electrode, and a source region are arranged in the first direction from the first pixel to the second pixel.

13. A display device comprising a light emitting device according to claim 1 and an active element connected to the light emitting device.

14. A photoelectric conversion device comprising an optical unit including a plurality of lenses, an imaging element configured to receive light having passed through the optical unit, and a display unit configured to display an image, wherein the display unit displays an image captured by the imaging element, and includes the light emitting device according to claim 1.

15. An electronic device comprising a housing provided with a display unit, and a communication unit provided in the housing and configured to perform external communication, wherein the display unit includes the light emitting device according to claim 1.

16. An illumination device comprising a light source and at least one of a light-diffusing unit and an optical film, wherein the light source includes the light emitting device according to claim 1.

17. A mobile device comprising a main body and a lighting appliance provided in the main body, wherein the lighting appliance includes the light emitting device according to claim 1.

18. The device according to claim 1, wherein the source region, the gate electrode, and the drain region of the first transistor of the first pixel and the source region, the gate electrode, and the drain region of the first transistor of the second pixel are arranged to overlap a virtual line that is along the first direction.

19. A light emitting device comprising a plurality of pixels arranged on a substrate in an array in a first direction and a second direction intersecting the first direction, wherein each of the plurality of pixels includes a light emitting element, a first transistor having a drain region connected to an anode of the light emitting element, and a second transistor having a drain region connected to a gate electrode of the first transistor, wherein the plurality of pixels include a first pixel and a second pixel, which are adjacent to each other in the first direction, wherein a source region of the second transistor of the first pixel and a source region of the second transistor of the second pixel share one diffusion region, and wherein a source region, a gate electrode, and the drain region of the first transistor of the first pixel and a source region, a gate electrode, and the drain region of the first transistor of the second pixel are sequentially arranged in one of a positive direction and a negative direction in the first direction, wherein the second transistor of the first pixel and the second transistor of the second pixel are arranged between the first transistor of the first pixel and the first transistor of the second pixel, wherein each of the plurality of pixels further includes a third transistor having a drain region connected to the source region of the first transistor and configured to control light emission or non-light emission of the light emitting element, wherein in the first direction, the third transistor of the first pixel and the third transistor of the second pixel are arranged between the first transistor of the first pixel and the first transistor of the second pixel, wherein a source region of the third transistor of the first pixel and a source region of the third transistor of the second pixel share one diffusion region, and wherein the second transistors of the first pixel and the second pixel and the third transistors of the first pixel and the second pixel are arranged side by side in the second direction.

20. A light emitting device comprising a plurality of pixels arranged on a substrate in an array in a first direction and a second direction intersecting the first direction, wherein each of the plurality of pixels includes a light emitting element, a first transistor having a drain region connected to an anode of the light emitting element, and a second transistor having a drain region connected to a gate electrode of the first transistor, wherein the plurality of pixels include a first pixel and a second pixel, which are adjacent to each other in the first direction, wherein a source region of the second transistor of the first pixel and a source region of the second transistor of the second pixel share one diffusion region, and wherein a source region, a gate electrode, and the drain region of the first transistor of the first pixel and a source region, a gate electrode, and the drain region of the first transistor of the second pixel are sequentially arranged in one of a positive direction and a negative direction in the first direction, wherein the second transistor of the first pixel and the second transistor of the second pixel are arranged between the first transistor of the first pixel and the first transistor of the second pixel, wherein each of the plurality of pixels further includes a third transistor having a drain region connected to the source region of the first transistor and configured to control light emission or non-light emission of the light emitting element, and a fourth transistor configured to reset the light emitting element, and wherein, in the first direction, the third transistor of the first pixel and the fourth transistor of the second pixel are arranged between the first transistor of the first pixel and the first transistor of the second pixel, the fourth transistor of the first pixel is arranged on a side, opposite to the second pixel, of the first transistor of the first pixel, and the third transistor of the second pixel is arranged on a side, opposite to the first pixel, of the first transistor of the second pixel, and the second transistors of the first pixel and the second pixel and the third transistor of the first pixel and the fourth transistor of the second pixel are arranged side by side in the second direction.

21. The device according to claim 20, wherein a drain region of the fourth transistor of the first pixel and a drain region of the fourth transistor of the second pixel share one diffusion region.

22. The device according to claim 20, wherein the plurality of pixels further include a third pixel arranged adjacent to the first pixel in the second direction, and a fourth pixel arranged adjacent to the third pixel in the first direction and adjacent to the second pixel in the second direction, in the first direction, the second transistor of the third pixel, the second transistor of the fourth pixel, the fourth transistor of the third pixel, and the fourth transistor of the fourth pixel are arranged between the first transistor of the third pixel and the first transistor of the fourth pixel, the third transistor of the third pixel is arranged between the first transistor of the third pixel and the second transistor of the third pixel, and the third transistor of the fourth pixel is arranged on a side, opposite to the third pixel, of the first transistor of the fourth pixel, the fourth transistor of the first pixel, the fourth transistor of the second pixel, the fourth transistor of the third pixel, and the fourth transistor of the fourth pixel are arranged between the second transistors of the first pixel and the second pixel and the second transistors of the third pixel and the fourth pixel in the second direction, and a drain region of the fourth transistor of the first pixel, a drain region of the fourth transistor of the second pixel, a drain region of the fourth transistor of the third pixel, and a drain region of the fourth transistor of the fourth pixel share one diffusion region.

23. The device according to claim 20, wherein a source region, a gate electrode, and the drain region of the third transistor of the first pixel and a source region, a gate electrode, and the drain region of the third transistor arranged in the second pixel are sequentially arranged in one of a positive direction and a negative direction in the first direction.

24. A light emitting device comprising a plurality of pixels arranged on a substrate in an array in a first direction and a second direction intersecting the first direction, wherein each of the plurality of pixels includes a light emitting element, a first transistor having a drain region connected to an anode of the light emitting element, and a second transistor having a drain region connected to a gate electrode of the first transistor, wherein the plurality of pixels include a first pixel and a second pixel, which are adjacent to each other in the first direction, wherein a source region of the second transistor of the first pixel and a source region of the second transistor of the second pixel share one diffusion region, and wherein a source region, a gate electrode, and the drain region of the first transistor of the first pixel and a source region, a gate electrode, and the drain region of the first transistor of the second pixel are sequentially arranged in one of a positive direction and a negative direction in the first direction, wherein the second transistor of the first pixel and the second transistor of the second pixel are arranged between the first transistor of the first pixel and the first transistor of the second pixel, wherein each of the plurality of pixels further includes a third transistor having a drain region connected to the source region of the first transistor and configured to control light emission or non-light emission of the light emitting element, and a fourth transistor configured to reset the light emitting element, and wherein, in the first direction, the fourth transistor of the first pixel and the fourth transistor of the second pixel are arranged between the first transistor of the first pixel and the first transistor of the second pixel, the third transistor of the first pixel is arranged between the first transistor of the first pixel and the second transistor of the first pixel, and the third transistor of the second pixel is arranged on a side, opposite to the first pixel, of the first transistor of the second pixel, and the second transistors of the first pixel and the second pixel and the fourth transistors of the first pixel and the second pixel are arranged side by side in the second direction.

* * * * *